(12) United States Patent
Yang et al.

(10) Patent No.: US 11,694,607 B2
(45) Date of Patent: Jul. 4, 2023

(54) LIGHT EMITTING SUBSTRATE, DISPLAY APPARATUS, AND METHOD OF DRIVING LIGHT EMITTING SUBSTRATE

(71) Applicant: BOE Technology Group Co., Ltd., Beijing (CN)

(72) Inventors: Ming Yang, Beijing (CN); Fuqiang Li, Beijing (CN); Xingce Shang, Beijing (CN); Wei Hao, Beijing (CN); Lin Zhou, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/631,586

(22) PCT Filed: Mar. 4, 2021

(86) PCT No.: PCT/CN2021/079091
§ 371 (c)(1),
(2) Date: Jan. 31, 2022

(87) PCT Pub. No.: WO2022/183441
PCT Pub. Date: Sep. 9, 2022

(65) Prior Publication Data
US 2023/0154385 A1 May 18, 2023

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 33/62* (2013.01);
(Continued)

(58) Field of Classification Search
CPC ................. G09G 3/32; G09G 2310/08; G09G 2320/0233; G09G 2330/021;
(Continued)

(56) References Cited

U.S. PATENT DOCUMENTS

| 7,903,072 B2* | 3/2011 | Yamazaki | G09G 3/3688 345/98 |
| 9,013,520 B2* | 4/2015 | Matsui | G09G 3/30 349/143 |

(Continued)

FOREIGN PATENT DOCUMENTS

| CN | 107564478 A * | 1/2018 | .......... G09G 3/2003 |
| CN | 106406612 B | 7/2019 | |

(Continued)

OTHER PUBLICATIONS

The Extended European Search Report in the European Patent Application No. 21928526.9, dated Mar. 31, 2023.

*Primary Examiner* — Vinh T Lam
(74) *Attorney, Agent, or Firm* — Intellectual Valley Law, P.C.

(57) ABSTRACT

A light emitting substrate is provided. The light emitting substrate includes a plurality of light emitting controlling units arranged in M rows and N columns, M is an integer equal to or greater than one, N is an integer equal to or greater than one. A respective column of the N columns of light emitting controlling units includes M number of groups of second voltage signal lines, a respective group of the M number of groups of second voltage signal lines connected to a respective one of the M number of light emitting controlling units, the respective group of the M number of groups of second voltage signal lines including k number of second voltage signal lines, k is an integer equal to or greater than one.

20 Claims, 13 Drawing Sheets

(51) Int. Cl.
  *H01L 33/62* (2010.01)
  *H01L 23/00* (2006.01)

(52) U.S. Cl.
  CPC . *G09G 2310/08* (2013.01); *G09G 2320/0233* (2013.01); *G09G 2330/021* (2013.01); *H01L 24/05* (2013.01); *H01L 2224/05572* (2013.01); *H01L 2224/05573* (2013.01); *H01L 2224/05609* (2013.01)

(58) Field of Classification Search
  CPC ..... H01L 25/0753; H01L 33/62; H01L 24/05; H01L 2224/05572; H01L 2224/05573; H01L 2224/05609
  See application file for complete search history.

(56) References Cited

U.S. PATENT DOCUMENTS

| | | | |
|---|---|---|---|
| 9,466,255 B2 * | 10/2016 | Park | G09G 3/3614 |
| 10,950,167 B1 | 3/2021 | Chan et al. | |
| 11,042,062 B2 * | 6/2021 | Chang | H01L 33/62 |
| 11,282,467 B1 * | 3/2022 | Tu | G09G 3/3607 |
| 11,328,648 B2 * | 5/2022 | Zhang | G09G 3/2074 |
| 11,398,200 B2 * | 7/2022 | Chen | G09G 3/3677 |
| 11,514,842 B2 * | 11/2022 | Jung | H01L 25/0753 |
| 11,568,820 B2 * | 1/2023 | Feng | G11C 19/287 |
| 2012/0026154 A1 * | 2/2012 | Tsuchi | H03M 1/66 |
| | | | 345/212 |
| 2013/0069854 A1 * | 3/2013 | Park | G09G 3/3233 |
| | | | 345/82 |
| 2013/0222216 A1 * | 8/2013 | Park | G09G 3/3688 |
| | | | 345/55 |
| 2014/0035890 A1 * | 2/2014 | Jinta | G09G 3/3233 |
| | | | 345/55 |
| 2016/0260376 A1 | 9/2016 | Shin et al. | |
| 2017/0125506 A1 * | 5/2017 | Kim | G09G 3/3225 |
| 2021/0118970 A1 | 4/2021 | Song et al. | |
| 2021/0193067 A1 * | 6/2021 | Shao | G09G 3/3685 |
| 2021/0398472 A1 * | 12/2021 | Kim | G09G 3/3291 |
| 2022/0020313 A1 * | 1/2022 | Yeh | G09G 3/3674 |
| 2022/0149079 A1 | 5/2022 | Kang et al. | |
| 2022/0157230 A1 * | 5/2022 | Suzuki | G09G 3/32 |
| 2022/0172669 A1 * | 6/2022 | Liu | G09G 3/32 |
| 2022/0199039 A1 * | 6/2022 | Lee | G09G 3/3266 |
| 2022/0208113 A1 * | 6/2022 | Choi | G09G 3/3233 |
| 2022/0208115 A1 * | 6/2022 | Kim | G09G 3/3275 |
| 2022/0343843 A1 * | 10/2022 | Du | G09G 3/3233 |
| 2022/0406260 A1 * | 12/2022 | Pang | G09G 3/3233 |

FOREIGN PATENT DOCUMENTS

| | | | |
|---|---|---|---|
| CN | 111462646 A | 7/2020 | |
| WO | 2019227385 A1 | 12/2019 | |
| WO | 2020166774 A1 | 8/2020 | |
| WO | 2020259473 A1 | 12/2020 | |
| WO | WO-2021227713 A1 * | 11/2021 | G01R 31/52 |

* cited by examiner

LIGHT EMITTING SUBSTRATE, DISPLAY APPARATUS, AND METHOD OF DRIVING LIGHT EMITTING SUBSTRATE

CROSS-REFERENCE TO RELATED APPLICATION

This application is a national stage application under 35 U.S.C. § 371 of International Application No. PCT/CN2021/079091, filed Mar. 4, 2021, the contents of which are incorporated by reference in the entirety.

TECHNICAL FIELD

The present invention relates to display technology, more particularly, to a light emitting substrate, a display apparatus, and a method of driving a light emitting substrate.

BACKGROUND

A front-lit reflective display apparatus is a display apparatus illuminated by a front light. Typically, the front-lit reflective display apparatus is a liquid crystal display apparatus, which would otherwise by viewed in ambient light. Having a front light improves the display performance.

SUMMARY

In one aspect, the present disclosure provides a light emitting substrate, comprising a plurality of light emitting controlling units arranged in M rows and N columns, M is an integer equal to or greater than one, N is an integer equal to or greater than one; wherein a respective column of the N columns of light emitting controlling units comprises M number of groups of second voltage signal lines, a respective group of the M number of groups of second voltage signal lines connected to a respective one of the M number of light emitting controlling units, the respective group of the M number of groups of second voltage signal lines comprising k number of second voltage signal lines, k is an integer equal to or greater than one; wherein the respective one of the plurality of light emitting controlling units comprises p number of sub-units, p is an integer equal to or greater than one; p number of first voltage branch signal lines respectively connected to the p number of sub-units; p number of groups of second voltage branch signal lines, a respective group of the p number of groups of second voltage branch signal lines comprising k number of second voltage branch signal lines; wherein the p number of first voltage branch signal lines are electrically connected; and the k number of second voltage branch signal lines are respectively electrically connected to the k number of second voltage signal lines in the respective group of the M number of groups of second voltage signal lines.

Optionally, the respective one of the plurality of light emitting controlling units comprises a plurality of light emitting elements arranged in m rows and n columns, m is an integer equal to or greater than p, n is an integer equal to or greater than one; a P-th sub-unit of the p number of sub-units comprises n columns of light emitting elements, $1 \leq P \leq p$; first terminals of the n columns of light emitting elements in the P-th sub-unit are commonly connected to a P-th first voltage branch signal line of the p number of first voltage branch signal lines; and a respective second terminal of second terminals of the n columns of light emitting elements in the P-th sub-unit is connected to one of the k number of second voltage branch signal lines in a P-th group of the p number of groups of second voltage branch signal lines.

Optionally, each of the n columns of light emitting elements in the respective one of the plurality of light emitting controlling units comprises multiple rows of light emitting elements electrically connected in series.

Optionally, the multiple rows of light emitting elements in a respective one of the n columns of light emitting elements are of a same color.

Optionally, the respective one of the n columns of light emitting elements comprises light emitting elements of a K-th color of k number of different colors, $1 \leq K \leq k$; and light emitting elements in (n/k) number of columns out of the n columns of light emitting elements are of the K-th color.

Optionally, second terminals of the (n/k) number of columns out of the n columns of light emitting elements are commonly connected to a K-th second voltage branch signal line of the k number of second voltage branch signal lines in the P-th group of the p number of groups of second voltage branch signal lines.

Optionally, m is a (x*p), n is a (y*k), wherein x is an integer greater than one, and y is an integer greater than one.

Optionally, the n columns of light emitting elements in the P-th sub-unit comprise y groups of columns; a Y-th group of the y groups of columns comprises k number of columns of light emitting elements respectively of k number of different colors, $1 \leq Y \leq y$; and color patterns in y groups of columns are same.

Optionally, the light emitting substrate further comprises at least one first voltage signal line connected to the p number of first voltage branch signal lines in at least one of the M number of light emitting controlling units.

Optionally, the n columns of light emitting elements comprises n columns of micro light emitting diodes.

Optionally, the light emitting substrate comprises a base substrate; a first metal layer and a second metal layer on the base substrate; and at least one insulating layer spacing apart the first metal layer from the second metal layer.

Optionally, the light emitting substrate further comprises a plurality of signal lines; wherein the plurality of signal lines comprise multiple signal lines extending along a first direction and multiple signal lines extending along a second direction, the second direction being different from the first direction; the multiple signal lines extending along the first direction are parts of one of the first metal layer and the second metal layer; and the multiple signal lines extending along the second direction are parts of another of the first metal layer and the second metal layer.

Optionally, the light emitting substrate further comprising a black matrix on the base substrate; wherein orthographic projections of the first metal layer and the second metal layer on the base substrate are within an orthographic projection of the black matrix on the base substrate.

Optionally, the black matrix comprises multiple first black matrix lines extending along the first direction and multiple second black matrix lines extending along the second direction; and an orthographic projections of a combination of the black matrix and the plurality of signal lines on the base substrate is a grid.

Optionally, the multiple first black matrix lines are arranged along the second direction; the multiple second black matrix lines are arranged along the first direction; any two adjacent first black matrix lines of the multiple first black matrix lines are spaced apart by a same distance along the second direction; and any two adjacent second black matrix lines of the multiple second black matrix lines are spaced apart by a same distance along the first direction.

Optionally, a line width of a respective one of the plurality of signal lines along the first direction is smaller than a line width of black matrix lines along the first direction; and a line width of a respective one of the plurality of signal lines along the second direction is smaller than a line width of black matrix lines along the second direction.

Optionally, the multiple signal lines extending along the first direction comprise second voltage signal lines; and the multiple signal lines extending along the second direction comprise first voltage branch signal lines and second voltage branch signal lines.

Optionally, the light emitting substrate further comprises a first resin layer between the black matrix and the first metal layer; wherein the at least one insulating layer comprises a second resin layer.

Optionally, the light emitting substrate further comprises a first passivation layer between the first resin layer and the first metal layer; wherein the at least one insulating layer further comprises a second passivation layer between the second resin layer and the first metal layer, and a third passivation layer between the second resin layer and the second metal layer.

Optionally, the light emitting substrate further comprises a fourth passivation layer on a side of the second metal layer away from the base substrate; and at least two vias extending through the fourth passivation layer and partially exposing a surface of the second metal layer.

Optionally, each of the first metal layer and the second metal layer comprises copper; and the second metal layer further comprises nickel gold on the surface partially exposed by the at least two vias.

Optionally, each of the first metal layer and the second metal layer comprises copper; and the second metal layer further comprises indium tin oxide on the surface partially exposed by the at least two vias.

Optionally, the light emitting substrate further comprises at least one gas releasing via.

Optionally, the at least one gas releasing via comprises a first gas releasing via extending through a first passivation layer and a second passivation layer and a second gas releasing via extending through a third passivation layer and a fourth passivation layer.

Optionally, orthographic projections of the first gas releasing via and the second gas releasing via on the base substrate at least partially overlap with each other.

Optionally, the light emitting substrate comprises a plurality of first gas releasing vias arranged in a first array and a plurality of second gas releasing vias arranged in a second array.

In another aspect, the present disclosure provides a display apparatus, comprising the light emitting substrate described herein or fabricated by a method described herein, a reflective-type display panel, and an integrated circuit connected to the reflective-type display panel; wherein the light emitting substrate is on a display side of the reflective-type display panel.

Optionally, the reflective-type display panel comprises a plurality of first signal lines and a plurality of second signal lines; the light emitting substrate comprises a plurality of signal lines; the plurality of signal lines comprise multiple signal lines extending along a first direction and multiple signal lines extending along a second direction, the second direction being different from the first direction; the multiple signal lines extending along the first direction cross over the plurality of first signal lines at an angle greater than zero and less than 20 degrees, and/or the multiple signal lines extending along the second direction cross over the plurality of second signal lines at an angle greater than zero and less than 20 degrees; and the plurality of first signal lines are a plurality of data lines and the plurality of second signal lines are a plurality of gate lines.

In another aspect, the present disclosure provides a method of driving a light emitting substrate; wherein the light emitting substrate comprises a plurality of light emitting controlling units arranged in M rows and N columns, M is an integer equal to or greater than one, N is an integer equal to or greater than one; wherein the method comprises connecting a respective group of M number of groups of second voltage signal lines to a respective one of the M number of light emitting controlling units, the respective group of the M number of groups of second voltage signal lines comprising k number of second voltage signal lines, k is an integer equal to or greater than one; wherein the respective one of the plurality of light emitting controlling units comprises p number of sub-units, p is an integer equal to or greater than one; where the method further comprises respectively connecting p number of first voltage branch signal lines to the p number of sub-units; respectively electrically connecting k number of second voltage branch signal lines to the k number of second voltage signal lines in the respective group of the M number of groups of second voltage signal lines; providing a second voltage signal to p number of groups of second voltage branch signal lines, a respective group of the p number of groups of second voltage branch signal lines comprising the k number of second voltage branch signal lines; electrically connecting the p number of first voltage branch signal lines; and providing a first voltage signal to the p number of first voltage branch signal lines.

Optionally, the respective one of the plurality of light emitting controlling units comprises a plurality of light emitting elements arranged in m rows and n columns, m is an integer equal to or greater than p, n is an integer equal to or greater than one; and a P-th sub-unit of the p number of sub-units comprises n columns of light emitting elements, $1 \leq P \leq p$; wherein the method further comprises commonly connecting first terminals of the n columns of light emitting elements in the P-th sub-unit to a P-th first voltage branch signal line of the p number of first voltage branch signal lines; and connecting a respective second terminal of second terminals of the n columns of light emitting elements in the P-th sub-unit to one of the k number of second voltage branch signal lines in a P-th group of the p number of groups of second voltage branch signal lines.

Optionally, the method further comprises time-sequentially applying the first voltage signal to the M number of light emitting controlling units; and during a period in which the first voltage signal is applied to the respective one of the M number of light emitting controlling units, time-sequentially applying the second voltage signal to the k number of second voltage signal lines.

Optionally, the first voltage signal is simultaneously applied to the p number of first voltage branch signal lines during the period in which the first voltage signal is applied to the respective one of the M number of light emitting controlling units; and during a period in which the second voltage signal is applied to a K-th second voltage signal line of the k number of second voltage signal lines, the second voltage signal is simultaneously applied to K-th second voltage branch signal lines of the k number of second voltage branch signal lines in all of the p number of groups of second voltage branch signal lines, $1 \leq K \leq k$.

Optionally, the first voltage signal is simultaneously applied to the first terminals of the p number of sub-units respectively through the p number of first voltage branch signal lines, during the period in which the first voltage signal is applied to the respective one of the M number of light emitting controlling units; and during a period in which the second voltage signal is applied to the K-th second voltage signal line of the k number of second voltage signal lines, the second voltage signal is simultaneously applied to second terminals that are connected to the K-th second voltage branch signal lines of the k number of second voltage branch signal lines, the second terminals that are connected to the K-th second voltage branch signal lines being respectively from the p number of sub-units.

Optionally, a duration of a frame of image comprises $\Sigma_2^k TK$; TK stands for a light emitting duration for light emitting elements of a K-th color in the M number of light emitting controlling units; during the TK duration, the first voltage signal is time-sequentially applied to the M number of light emitting controlling units, and the second voltage signal is time-sequentially applied to K-th second voltage signal lines respectively from the M number of groups of second voltage signal lines; and the light emitting elements of the K-th color in the M number of light emitting controlling units are configured to time-sequentially emit a red light during the T1 duration, light emitting controlling unit after light emitting controlling unit.

Optionally, a K-th second voltage signal line in a first light emitting controlling unit of two adjacent light emitting controlling units is provided with the second voltage signal at a first time point Tn; a K-th second voltage signal line in a second light emitting controlling unit of the two adjacent light emitting controlling units is provided with the second voltage signal at a second time point T(n+1); and T(n+1)= Tn+TK/M.

In another aspect, the present disclosure provides a method of driving a reflective display apparatus, comprising assembling a reflective display panel and a light emitting substrate together, wherein the light emitting substrate comprises a plurality of light emitting controlling units arranged in M rows and N columns, M is an integer equal to or greater than one, N is an integer equal to or greater than one; respectively connecting M number of first voltage signal lines to M number of light emitting controlling units in a respective column of the N columns of light emitting controlling units; and connecting a respective group of M number of groups of second voltage signal lines to a respective one of the M number of light emitting controlling units, the respective group of the M number of groups of second voltage signal lines comprising k number of second voltage signal lines, k is an integer equal to or greater than one; wherein the respective one of the plurality of light emitting controlling units comprises p number of sub-units, p is an integer equal to or greater than one; wherein the method further comprises driving the light emitting substrate according to the method described herein.

Optionally, the method further comprises applying gate scanning signals respectively to g number of gate lines corresponding to a respective first voltage signal line to turn on subpixels corresponding to light emitting elements connected to the K-th second voltage branch signal lines of the k number of second voltage branch signal lines in all of the p number of groups of second voltage branch signal lines; wherein applying the first voltage signal to the respective one of the M number of first voltage signal lines and applying the second voltage signal to the K-th second voltage branch signal lines of the k number of second voltage branch signal lines in all of the p number of groups of second voltage branch signal lines are performed subsequent to applying gate scanning signals respectively to the g number of gate lines corresponding to the respective first voltage signal line to turn on subpixels corresponding to light emitting elements connected to the K-th second voltage branch signal lines of the k number of second voltage branch signal lines in all of the p number of groups of second voltage branch signal lines.

Optionally, a starting time point for the light emitting elements connected to the K-th second voltage branch signal lines of the k number of second voltage branch signal lines in all of the p number of groups of second voltage branch signal lines is later than a starting time point for applying a gate scanning signal to a first gate line of the g number of gate lines corresponding to the respective first voltage signal line by (m×t0), wherein t0 is a duration for scanning one row of light emitting elements in the reflective display panel.

Optionally, the method further comprises applying gate scanning signals respectively to the g number of gate lines corresponding to the respective first voltage signal line to turn on subpixels corresponding to light emitting elements connected to a (K+1)-th second voltage branch signal lines of the k number of second voltage branch signal lines in all of the p number of groups of second voltage branch signal lines; upon completion of applying gate scanning signals respectively to the g number of gate lines corresponding to the respective first voltage signal line to turn on subpixels corresponding to light emitting elements connected to the (K+1)-th second voltage branch signal lines, applying the first voltage signal to the respective one of the M number of first voltage signal lines and applying the second voltage signal to the (K+1)-th second voltage branch signal lines of the k number of second voltage branch signal lines in all of the p number of groups of second voltage branch signal lines.

Optionally, the light emitting elements connected to the K-th second voltage branch signal lines of the k number of second voltage branch signal lines in all of the p number of groups of second voltage branch signal lines are configured to emit light for a duration of TK; and a sum of light emitting durations for light emitting elements connected to all of the p number of groups of second voltage branch signal lines equals to a duration of a frame of image in the reflective display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a light emitting substrate, a display apparatus, and a method of driving a light emitting substrate that substantially obviate one or more of the problems due to limitations and disadvantages of the related art. In one aspect, the present disclosure provides a light emitting substrate. In some embodiments, the light emitting substrate includes a plurality of light emitting controlling units arranged in M rows and N columns, M is an integer equal to or greater than one, N is an integer equal to or greater than one. In some embodiments, a respective column of the N columns of light emitting controlling units includes M number of groups of second voltage signal lines. Optionally, a respective group of the M number of groups of second voltage signal lines is connected to a respective one of the M number of light emitting controlling units. Optionally, the respective group of the M number of groups of second voltage signal lines includes k number of second voltage signal lines, k is an integer equal to or greater than one. Optionally, the respective one of the plurality of light emitting controlling units includes p number of sub-units, p is an integer equal to or greater than one; p number of first voltage branch signal lines respectively connected to the p number of sub-units; and p number of groups of second voltage branch signal lines, a respective group of the p number of groups of second voltage branch signal lines including k number of second voltage branch signal lines. Optionally, the p number of first voltage branch signal lines are electrically connected. Optionally, the k number of second voltage branch signal lines are respectively electrically connected to the k number of second voltage signal lines in the respective group of the M number of groups of second voltage signal lines.

Figure 1:
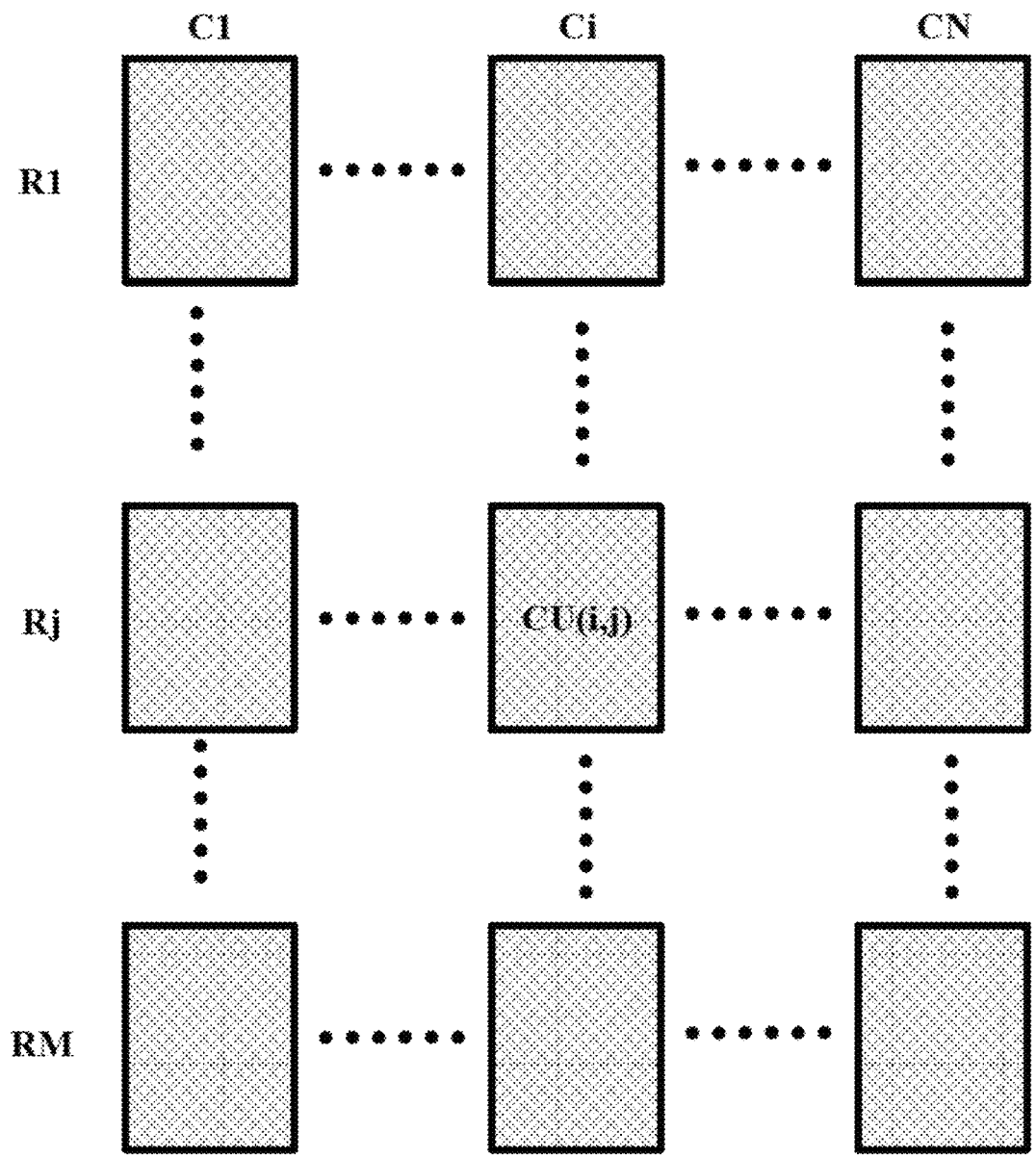
FIG. 1 is a schematic diagram illustrating the structure of a light emitting substrate in some embodiments according to the present disclosure.

FIG. 1 is a schematic diagram illustrating the structure of a light emitting substrate in some embodiments according to the present disclosure. Referring to FIG. 1, the light emitting substrate in some embodiments includes a plurality of light emitting controlling units CU(i, j) arranged in M rows and N columns. M is an integer equal to or greater than one, N is an integer equal to or greater than one, $1 \leq i \leq N$, $1 \leq j \leq N$. As used herein, a row of light emitting controlling units is along a row direction, a column of light emitting controlling units is along a column direction, the row direction and the column direction are two non-parallel directions, e.g., the row direction and the column direction cross over each other. Optionally, the row direction and the column direction are perpendicular to each other. Optionally, the row direction and the column direction cross over each other at an inclined angle that is not 90 degrees.

Figure 2:
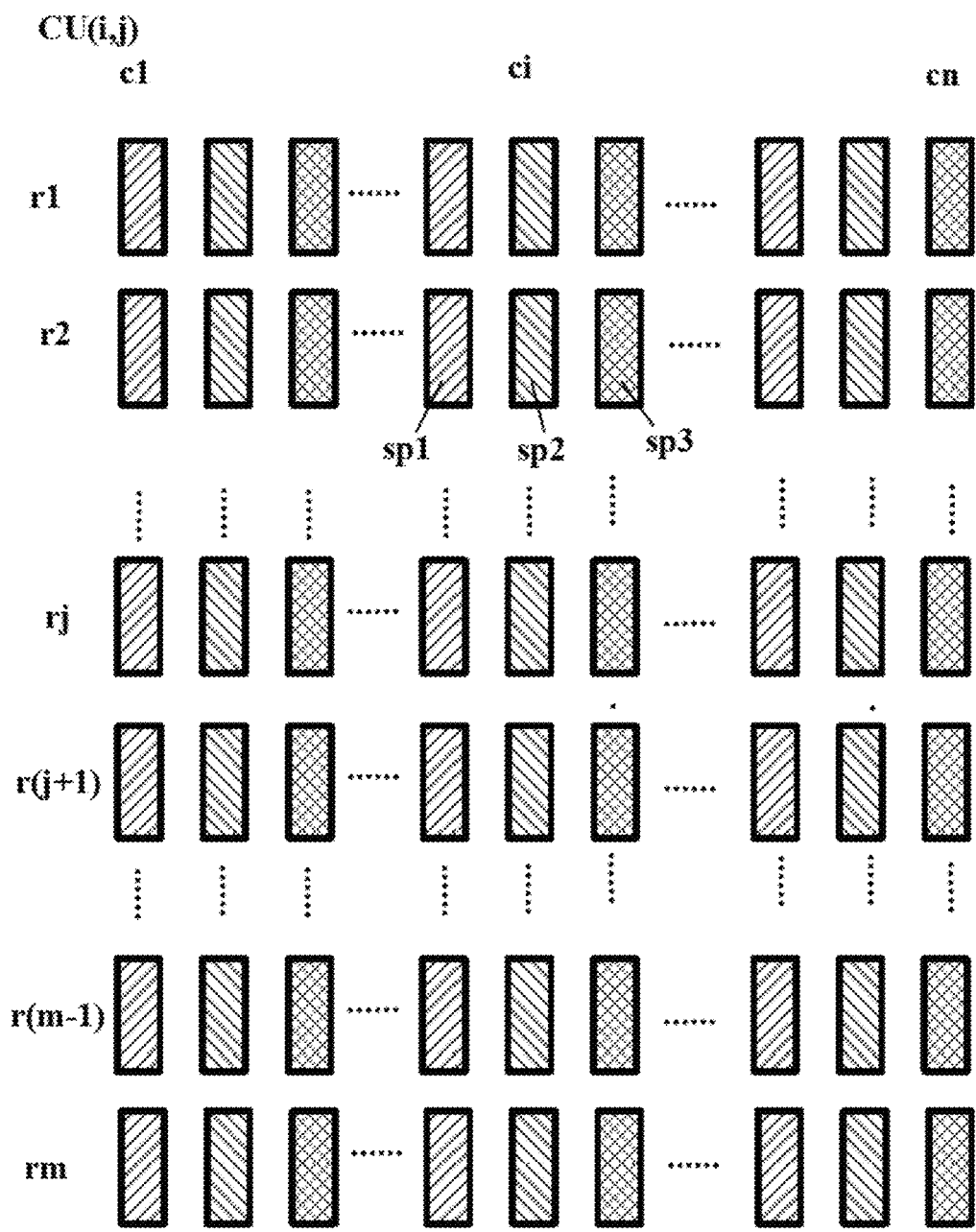
FIG. 2 is a schematic diagram illustrating the structure of a light emitting controlling unit in a light emitting substrate in some embodiments according to the present disclosure.

FIG. 2 is a schematic diagram illustrating the structure of a light emitting controlling unit in a light emitting substrate in some embodiments according to the present disclosure. Referring to FIG. 2, a respective one of the plurality of light emitting controlling units CU(i, j) is depicted. In some embodiments, the respective one of the plurality of light emitting controlling units CU(i, j) includes a plurality of light emitting elements arranged in in rows and n columns, in is an integer equal to or greater than one, and n is an integer equal to or greater than one. As shown in FIG. 2, in one example, the plurality of light emitting elements includes light emitting elements of different colors. e.g., a respective light emitting element of a first color sp1, a respective light emitting element of a second color sp2, and a respective light emitting element of a third color sp3. In another example, light emitting elements in a respective column of the respective one of the plurality of light emitting controlling units CU(i, j) are of a same color. For example, light emitting elements in column c1 are all light emitting elements of the first color, light emitting elements in column ci are all light emitting elements of the second color, and light emitting elements in column cn are all light emitting elements of the third color. In another example, a respective row of the respective one of the plurality of light emitting controlling units CU(i, j) includes light emitting elements arranged in repeating color patterns. For example, light emitting elements in row rj includes a repeating pattern of the respective light emitting element of a first color sp1, the respective light emitting element of a second color sp2, and the respective light emitting element of a third color sp3. As used herein, the term "color pattern" refers to a pattern of color(s) of light emitted by light emitting elements when lit.

Optionally, the light emitting elements are micro light emitting diodes.

In some embodiments, the respective column Ci of the N columns of light emitting controlling units includes at least one first voltage signal line (e.g., a single first voltage signal line), and the at least one first voltage signal line connected to the p number of first voltage branch signal lines in at least one of the M number of light emitting controlling units. Optionally, all of first voltage branch signal lines in all of the M number of light emitting controlling units are connected to the at least one first voltage signal line.

Figure 3:
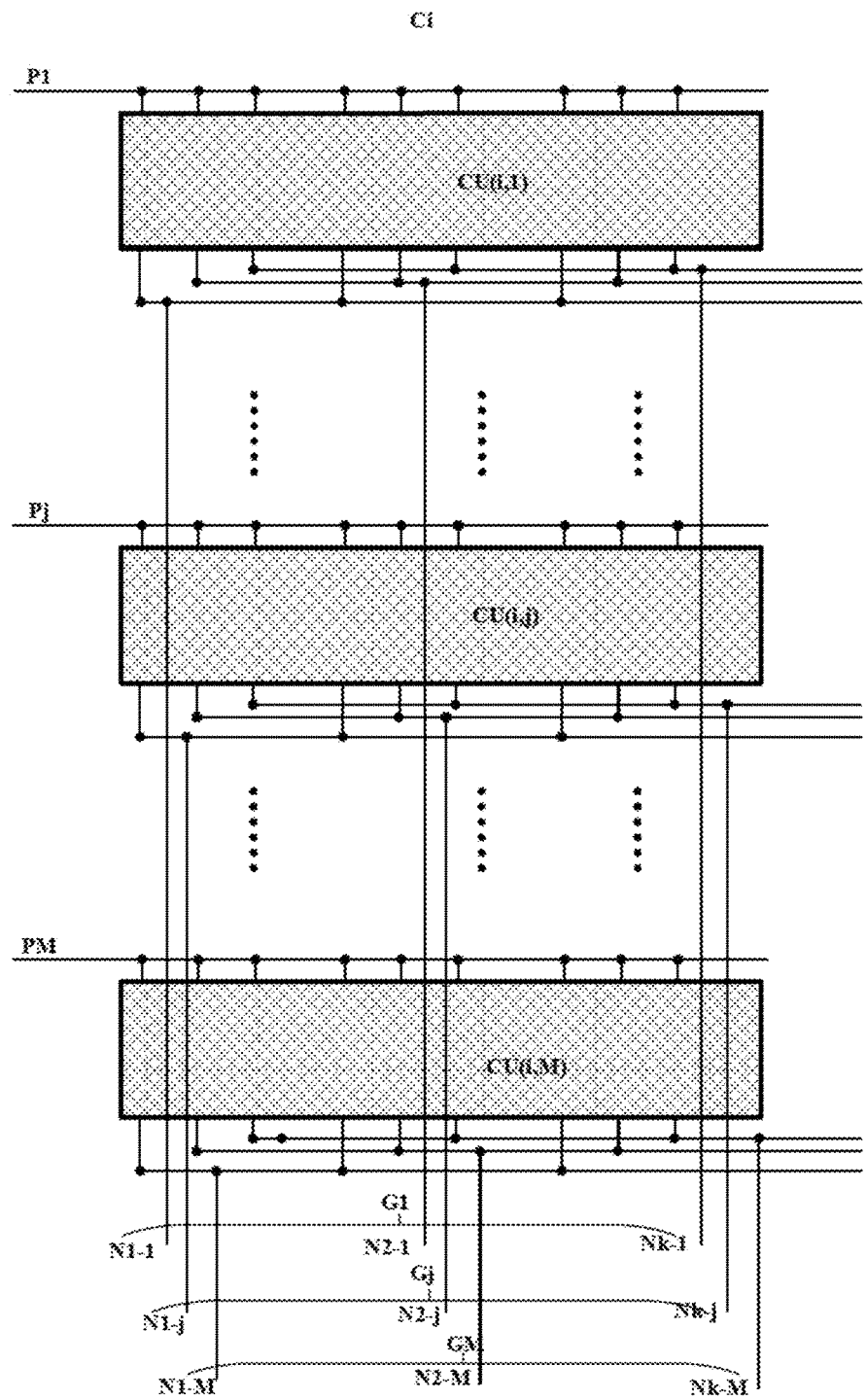
FIG. 3 is a schematic diagram illustrating the structure of a column of light emitting controlling units in a light emitting substrate in some embodiments according to the present disclosure.

FIG. 3 is a schematic diagram illustrating the structure of a column of light emitting controlling units in a light emitting substrate in some embodiments according to the present disclosure. Referring to FIG. 3, in some embodiments, a respective column $C_i$ of the N columns of light emitting controlling units includes M number of first voltage signal lines respectively connected to M number of light emitting controlling units; and M number of groups of second voltage signal lines. As shown in FIG. 3, the M number of first voltage signal lines include P1, . . . , Pj . . . . , PM. The M number of light emitting controlling units include CU(i1), . . . , CU(i, j), . . . , CU(i, M). The M number of first voltage signal lines P1, . . . , Pj, . . . , PM are respectively connected to the M number of light emitting controlling units CU(i1), . . . , CU(i, j), . . . , CU(i, M). The M number of groups of second voltage signal lines include G1, . . . Gj, . . . , GM.

In some embodiments, the light emitting substrate includes M×N number of first voltage signal lines, respectively corresponding to M×N number of light emitting controlling units, e.g., in a one-to-one relationship. A respective one of the M×N number of first voltage signal lines is connected to first voltage branch signal lines in a respective one of the M×N number of light emitting controlling units.

In some embodiments, a respective group of the M number of groups of second voltage signal lines connected to a respective one of the M number of light emitting controlling units. Referring to FIG. 3, a respective group G1 of the M number of groups of second voltage signal lines G1, . . . Gj, . . . , GM is connected to a respective one CU(i,1) of the M number of light emitting controlling units CU(i1) . . . , CU(i, j), . . . , CU(i, M). A respective group Gj of the M number of groups of second voltage signal lines G1, . . . Gj . . . , GM is connected to a respective one CU(i, j) of the M number of light emitting controlling units CU(i1), . . . , CU(i, j), . . . , CU(i, M). A respective group GM of the M number of groups of second voltage signal lines G1, . . . Gj, . . . , GM is connected to a respective one CU(i, M) of the M number of light emitting controlling units CU(i1), . . . , CU(i, j), . . . , CU(i, M).

In some embodiments, the respective group of the M number of groups of second voltage signal lines includes k number of second voltage signal lines, k is an integer equal to or greater than one. Referring to FIG. 3, a respective group G1 of the M number of groups of second voltage signal lines G1, . . . Gj . . . , GM includes k number of second voltage signal lines N1-1, N2-1 . . . , Nk-1. A respective group Gj of the M number of groups of second voltage signal lines G1, . . . Gj, . . . . GM includes k number of second voltage signal lines N1-$j$, N2-$j$, . . . , Nk-j. A respective group G1 of the M number of groups of second voltage signal lines G1, . . . Gj . . . , GM includes k number of second voltage signal lines N1-M, N2-M . . . . , Nk-M. Optionally, the respective one of the plurality of light emitting controlling units CU(i, j) includes light emitting elements of k number of different colors, e.g., sp1, sp2, . . . , spk. In some embodiments, the respective one of the plurality of light emitting controlling units CU(i, j) includes light emitting elements of three different colors, e.g., red light emitting elements, green light emitting elements, and blue light emitting elements, and k=3.

Figure 4:
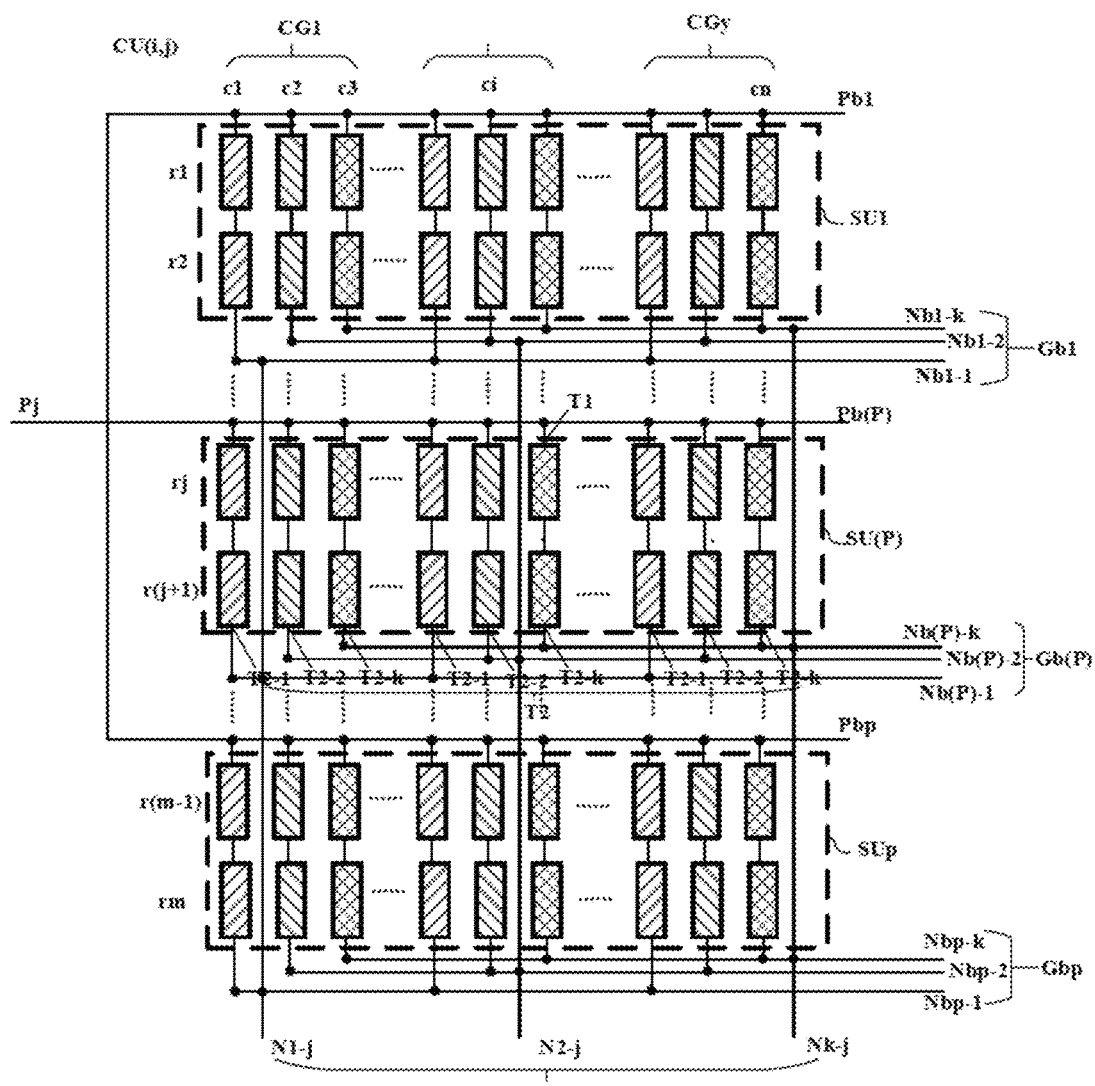
FIG. 4 is a schematic diagram illustrating the structure of a light emitting controlling unit in a light emitting substrate in some embodiments according to the present disclosure.

FIG. 4 is a schematic diagram illustrating the structure of a light emitting controlling unit in a light emitting substrate in some embodiments according to the present disclosure. Referring to FIG. 4, in some embodiments, the respective one of the plurality of light emitting controlling units includes p number of sub-units, p is an integer equal to or greater than one. For example, the p number of sub-units include SU1, . . . , SU(P), . . . , SUp, as shown in FIG. 4. The respective one of the plurality of light emitting controlling units further includes p number of first voltage branch signal lines respectively connected to the p number of sub-units. For example, the p number of first voltage branch signal lines include Pb1, . . . , Pbp, as shown in FIG. 4. The p number of first voltage branch signal lines Pb1, . . . , Pbp are respectively connected to the p number of sub-units SU1, . . . , SU(P), . . . , SUp. Moreover, the respective one of the plurality of light emitting controlling units further includes p number of groups of second voltage branch signal lines. For example, the p number of groups of second voltage branch signal lines include Gb1, . . . , Gbp, as shown in FIG. 4.

In some embodiments, the p number of first voltage branch signal lines are electrically connected, and are electrically connected to a respective one of the M number of first voltage signal lines. Referring to FIG. 4, the p number of first voltage branch signal lines Pb1, . . . , Pbp are electrically connected. The p number of first voltage branch signal lines Pb1, . . . , Pbp are commonly electrically connected to a respective one Pj of the M number of first voltage signal lines.

In some embodiments, a respective group of the p number of groups of second voltage branch signal lines includes k number of second voltage branch signal lines. For example, a respective group Gb1 of the p number of groups of second voltage branch signal lines includes k number of second voltage branch signal lines Nb1-1, Nb1-2, . . . . Nb1-$k$ in the respective group Gb1. A respective group Gb(P) of the p number of groups of second voltage branch signal lines includes k number of second voltage branch signal lines Nb(P)-1, Nb(P)-2, . . . , Nb(P)-k in the respective group Gb(P), 1≤P≤p. A respective group Gbp of the p number of groups of second voltage branch signal lines includes k number of second voltage branch signal lines Nbp-1, Nbp-2, . . . , Nbp-k in the respective group Gbp.

In some embodiments, the k number of second voltage branch signal lines are respectively electrically connected to the k number of second voltage signal lines in the respective group of the M number of groups of second voltage signal lines. Referring to FIG. 4, the k number of second voltage branch signal lines Nb1-1, Nb1-2, . . . , Nb1-$k$ in the respective group Gb1 are respectively electrically connected to the k number of second voltage signal lines N1-$j$, N2-$j$, . . . , Nk-j in the respective group Gj of the M number of groups of second voltage signal lines. Similarly, the k number of second voltage branch signal lines Nb(P)-1, Nb(P)-2, . . . , Nb(P)-k in the respective group Gb(P) are respectively electrically connected to the k number of second voltage signal lines N1-$j$, N2-$j$, . . . , Nk-j in the respective group Gj of the M number of groups of second voltage signal lines. Similarly, the k number of second voltage branch signal lines Nbp-1, Nbp-2 . . . . , Nbp-k in the respective group Gbp are respectively electrically connected to the k number of second voltage signal lines N1-$j$, N2-$j$, . . . , Nk-j in the respective group Gj of the M number of groups of second voltage signal lines.

In the present light emitting substrate, the light emitting elements of a same color are connected series and then in parallel. A total current of the light emitting substrate can be reduced. When the number of light emitting elements within each light emitting controlling unit is determined, the higher the number of light emitting elements connected in series, the smaller the total current in the light emitting controlling unit. When the line width and thickness of the metal lines are determined, the smaller the current density, the less power consumption is required. However, when the number of light emitting elements connected in series increase, the total current of the light emitting controlling unit is relatively small, due to the fact that the current of each light emitting element is small. This may make it difficult to drive the light emitting circuit. As compared to a light emitting substrate in which all light emitting elements of a same color are connected series, the present light emitting substrate adopts a combination of connection in series and connection in parallel, ensuring that the light emitting elements can be driven while at the same time reduces the power consumption.

In the present light emitting substrate, the light emitting elements of different colors are electrically connected to different second voltage signal lines. The light emitting elements of different colors (e.g., red, blue, green light emitting elements) have different I-V characteristics. In order to achieve different luminance for the light emitting elements of different colors, voltages for driving the light emitting elements of different colors are set to be different. Moreover, by independently driving the light emitting elements of different colors, the present light emitting substrate enables field sequence color display.

In some embodiments, a P-th sub-unit of the p number of sub-units includes n columns of light emitting elements, $1 \leq P \leq p$. Optionally, each of the n columns of light emitting elements includes multiple rows of light emitting elements electrically connected in series. Referring to FIG. 4, the P-th sub-unit SU(P) of the p number of sub-units includes n columns of light emitting elements (e.g., c1, . . . , ci, . . . , cn), each of the n columns of light emitting elements includes multiple rows of light emitting elements (e.g., rj and r(j+1)) connected in series. Similarly, the first sub-unit SU1 of the p number of sub-units includes n columns of light emitting elements (e.g., c1, . . . , ci, . . . , cn), each of the n columns of light emitting elements includes multiple rows of light emitting elements (e.g., r1 and r2) connected in series. Similarly, the last sub-unit SUp of the p number of sub-units includes n columns of light emitting elements (e.g., c1, . . . , ci, . . . , en), each of the n columns of light emitting elements includes multiple rows of light emitting elements (e.g., r(m-1) and nn) connected in series.

When a first voltage signal is applied to the respective one Pj of the M number of first voltage signal lines, the first voltage signal is applied to the p number of first voltage branch signal lines Pb1 . . . , Pbp. When a second voltage signal is applied to the second voltage signal lines N1-j, the second voltage signal is applied to the second voltage branch signal line Nb1-1 in the respective group Gb1, . . . , the second voltage branch signal line Nb(P)-1 in the respective group Gb(P), . . . , and the second voltage branch signal line N1p-1 in the respective group Gbp. When a second voltage signal is applied to the second voltage signal lines N2-j, the second voltage signal is applied to the second voltage branch signal line Nb1-2 in the respective group Gb1, . . . , the second voltage branch signal line Nb(P)-2 in the respective group Gb(P), . . . , and the second voltage branch signal line Nbp-2 in the respective group Gbp. When a second voltage signal is applied to the second voltage signal lines Nk-j, the second voltage signal is applied to the second voltage branch signal line Nb1-k in the respective group Gb1, . . . , the second voltage branch signal line Nb(P)-k in the respective group Gb(P), . . . , and the second voltage branch signal line Nbp-k in the respective group Gbp.

In some embodiments, a respective column of the n columns of light emitting elements in a respective sub-unit of the p number of sub-units includes a first terminal and a second terminal, respective at two ends of a structure comprising the multiple rows of light emitting elements electrically connected in series. Referring to FIG. 4, the n columns of light emitting elements in the P-th sub-unit SU(P) includes first terminals T1 and second terminals T2. A respective column of the columns of light emitting elements in the P-th sub-unit SU(P) includes a respective first terminal and a respective second terminal respective at two ends of a structure comprising rows rj and r(j+1) which are electrically connected in series. The first terminals T1 of the n columns of light emitting elements in the P-th sub-unit SU(P) are commonly connected to a P-th first voltage branch signal line Pb(P) of the p number of first voltage branch signal lines. Similarly, the first terminals T1 of the n columns of light emitting elements in the first sub-unit SU1 are commonly connected to a 1st first voltage branch signal line Pb1 of the p number of first voltage branch signal lines. Similarly, the first terminals T1 of the n columns of light emitting elements in the last sub-unit SUp are commonly connected to a p-th first voltage branch signal line Pb(P) of the p number of first voltage branch signal lines.

Optionally, a respective first terminal of the first terminals T1 is an anode of, or is connected to an anode of, one (e.g., a first one) of the multiple rows of light emitting elements electrically connected in series in a respective column of the n columns of light emitting elements in the P-th sub-unit SU(P); a respective second terminal of the second terminals T2 is a cathode of, or is connected to a cathode of, a another (e.g., a last one) of the multiple rows of light emitting elements electrically connected in series in a respective column of the n columns of light emitting elements in the P-th sub-unit SU(P).

Optionally, a respective first terminal of the first terminals T1 is a cathode of, or is connected to a cathode of, a first light emitting element of the multiple rows of light emitting elements electrically connected in series in a respective column of the n columns of light emitting elements in the P-th sub-unit SU(P); a respective second terminal of the second terminals T2 is an anode of, or is connected to an anode of, a last light emitting element of the multiple rows of light emitting elements electrically connected in series in a respective column of the n columns of light emitting elements in the P-th sub-unit SU(P).

As discussed above, when a first voltage signal is applied to the respective one Pj of the M number of first voltage signal lines, the first voltage signal is applied to the p number of first voltage branch signal lines Pb1, . . . , Pbp. Moreover, when a first voltage signal is applied to the respective one Pj of the M number of first voltage signal lines, the first voltage signal is applied to first terminals T1 of each of the p number of sub-units include SU1 . . . , SU(P), . . . , SUp.

In some embodiments, a respective second terminal of second terminals T2 of the n columns of light emitting elements in the P-th sub-unit SU(P) is connected to one of the k number of second voltage branch signal lines in a P-th group of the p number of groups of second voltage branch signal lines. Referring to FIG. 4, in the P-th sub-unit SU(P), $1 \leq P \leq p$, a first respective second terminal T2-1 of second terminals T2 of the n columns of light emitting elements in the P-th sub-unit SU(P) is connected to the second voltage branch signal line Nb(P)-1, a second respective second terminal T2-2 of second terminals T2 of the n columns of light emitting elements in the P-th sub-unit SU(P) is connected to the second voltage branch signal line Nb(P)-2, and a k-th respective second terminal T2-$k$ of second terminals T2 of the n columns of light emitting elements in the P-th sub-unit SU(P) is connected to the second voltage branch signal line Nb(P)-k. In one example, the respective one of the plurality of light emitting controlling units CU(i, j) includes light emitting elements of three different colors, e.g., red light emitting elements, green light emitting elements, and blue light emitting elements, and k=3.

As discussed above, when a second voltage signal is applied to the second voltage signal lines N1-$j$, the second voltage signal is applied to the second voltage branch signal line Nb(P)-1 in the respective group Gb(P), $1 \leq P \leq p$. Moreover, when a second voltage signal is applied to the second voltage signal lines N1-$j$, the second voltage signal is applied to the first respective second terminal T2-1 of second terminals T2 of the n columns of light emitting elements in the P-th sub-unit SU(P).

As discussed above, when a second voltage signal is applied to the second voltage signal lines N2-$j$, the second voltage signal is applied to the second voltage branch signal line Nb(P)-2 in the respective group Gb(P), $1 \leq P \leq p$. Moreover, when a second voltage signal is applied to the second voltage signal lines N2-$j$, the second voltage signal is applied to the second respective second terminal T2-2 of second terminals T2 of the n columns of light emitting elements in the P-th sub-unit SU(P).

As discussed above, when a second voltage signal is applied to the second voltage signal lines Nk-j, the second voltage signal is applied to the second voltage branch signal line Nb(P)-k in the respective group Gb(P), $1 \leq P \leq p$. Moreover, when a second voltage signal is applied to the second voltage signal lines Nk-j, the second voltage signal is applied to the k-th respective second terminal T2-$k$ of second terminals T2 of the n columns of light emitting elements in the P-th sub-unit SU(P).

In some embodiments, each of the n columns of light emitting elements includes a same number of rows of light emitting elements electrically connected in series. In one example, each of the n columns of light emitting elements includes (m/p) rows of light emitting elements electrically connected in series.

In some embodiments, the multiple rows of light emitting elements in a respective one of the n columns of light emitting elements includes light emitting elements of a same color. In one example, referring to FIG. 4, the multiple rows of light emitting elements in the c1 columnnof the n columns of light emitting elements includes light emitting elements of a first color (e.g., red); the multiple rows of light emitting elements in the c2 column of the n columns of light emitting elements includes light emitting elements of a second color (e.g., green); the multiple rows of light emitting elements in the c3 column of the n columns of light emitting elements includes light emitting elements of a third color (e.g., blue).

Moreover, in some embodiments, all rows of light emitting elements in a same column of light emitting elements from a plurality of light emitting controlling units includes light emitting elements of a same color. For example, all rows of light emitting elements in a first column of light emitting elements from the plurality of light emitting controlling units includes light emitting elements of a first color; all rows of light emitting elements in a second column of light emitting elements from the plurality of light emitting controlling units includes light emitting elements of a second color, and all rows of light emitting elements in a third column of light emitting elements from the plurality of light emitting controlling units includes light emitting elements of a third color.

In some embodiments, the respective one of the n columns of light emitting elements includes light emitting elements of a K-th color of k number of different colors, $1 \leq K \leq k$. Optionally, light emitting elements in (n/k) number of columns out of the n columns of light emitting elements are of the K-th color. In one example, k=3; light emitting elements in (n/3) number of columns out of the n columns of light emitting elements are of a first color (e.g., red); light emitting elements in (n/3) number of columns out of the n columns of light emitting elements are of a second color (e.g., green); and light emitting elements in (n/3) number of columns out of the n columns of light emitting elements are of a third color (e.g., blue).

In some embodiments, second terminals of the (n/k) number of columns out of the n columns of light emitting elements are commonly connected to a K-th second voltage branch signal line of the k number of second voltage branch signal lines in the P-th group of the p number of groups of second voltage branch signal lines. In one example, k=3; in the sub-unit SU(P), second terminals of the (n/3) number of columns out of the n columns of light emitting elements are commonly connected to a 1st second voltage branch signal line Nb(P)-1 of the k number of second voltage branch signal lines in the P-th group Gb(P) of the p number of groups of second voltage branch signal lines; second terminals of the (n/3) number of columns out of the n columns of light emitting elements are commonly connected to a 2nd second voltage branch signal line Nb(P)-2 of the k number of second voltage branch signal lines in the P-th group Gb(P) of the p number of groups of second voltage branch signal lines; and second terminals of the (n/3) number of columns out of the n columns of light emitting elements are commonly connected to a k-th second voltage branch signal line Nb(P)-k (where k=3) of the k number of second voltage branch signal lines in the P-th group Gb(P) of the p number of groups of second voltage branch signal lines. Specifically, first respective second terminals T2-1 are commonly connected to the 1st second voltage branch signal line Nb(P)-1; second respective second terminals T2-2 are commonly connected to the $2^{nd}$ second voltage branch signal line Nb(P)-2; and k-th respective second terminals T2-$k$ (wherein k=3) are commonly connected to the k-th second voltage branch signal line Nb(P)-k.

In some embodiments, and referring to FIG. 4, m is a (x*p), n is a (y*k), wherein x is an integer greater than one, and y is an integer greater than one. In FIG. 4, x=2, for example, each of the p number of sub-units includes two rows of light emitting elements. In FIG. 4, y≥3.

In some embodiments, and referring to FIG. 4, the n columns of light emitting elements in the P-th sub-unit include y groups of columns, e.g., CG1, . . . , CGy. Optionally, a Y-th group of the y groups of columns includes k number of columns of light emitting elements respectively of k number of different colors. In one example, k=3, the Y-th group of the y groups of columns includes three columns of light emitting elements respectively of three different colors, $1 \leq Y \leq y$. In another example, the Y-th group has a color pattern of red-green-blue. Optionally, color patterns in y groups of columns are same, for example, each of the y groups of columns has a same red-green-blue color pattern.

In another aspect, the present disclosure provides a display apparatus. In some embodiments, the display apparatus includes the light emitting substrate described herein or fabricated by a method described herein, a display panel, and an integrated circuit connected to the display panel. Optionally, the display panel is a reflective-type display panel.

The present light emitting substrate enables a direct-lit type front light source for the reflective-type display panel. In the present display apparatus, the present light emitting substrate is placed in front of the reflective-type display panel (on a display side of the display panel) to achieve the image display.

In some embodiments, the reflective-type display panel includes a plurality of first signal lines and a plurality of second signal lines. The light emitting substrate includes a plurality of signal lines. Optionally, the plurality of signal lines comprise multiple signal lines extending along a first direction and multiple signal lines extending along a second direction, the second direction being different from the first direction. Optionally, the multiple signal lines extending along the first direction cross over the plurality of first signal lines at an angle greater than zero and less than 20 degrees, and or the multiple signal lines extending along the second direction cross over the plurality of second signal lines at an angle greater than zero and less than 20 degrees. Optionally, the plurality of first signal lines are a plurality of data lines and the plurality of second signal lines are a plurality of gate lines. Optionally, the plurality of first signal lines are a plurality of gate lines and the plurality of second signal lines are a plurality of data lines.

In another aspect, the present disclosure provides a method of driving a light emitting substrate. In some embodiments, the light emitting substrate includes a plurality of light emitting controlling units arranged in M rows and N columns, M is an integer equal to or greater than one, N is an integer equal to or greater than one. In some embodiments, the method includes respectively connecting M number of first voltage signal lines to M number of light emitting controlling units in a respective column of the N columns of light emitting controlling units; and connecting a respective group of M number of groups of second voltage signal lines to a respective one of the M number of light emitting controlling units, the respective group of the M number of groups of second voltage signal lines comprising k number of second voltage signal lines, k is an integer equal to or greater than one. Optionally, the respective one of the plurality of light emitting controlling units comprises p number of sub-units, p is an integer equal to or greater than one. Optionally, the method further includes respectively connecting p number of first voltage branch signal lines to the p number of sub-units; respectively electrically connecting k number of second voltage branch signal lines to the k number of second voltage signal lines in the respective group of the M number of groups of second voltage signal lines; providing a second voltage signal to p number of groups of second voltage branch signal lines, a respective group of the p number of groups of second voltage branch signal lines comprising the k number of second voltage branch signal lines; electrically connecting the p number of first voltage branch signal lines to a respective one of the M number of first voltage signal lines; and providing a first voltage signal to the respective one of the M number of first voltage signal lines.

In some embodiments, the light emitting elements are, for example, mini light emitting diodes or micro light emitting diodes. The present method enables field sequence color display to achieve a high color gamut and highly uniform illuminance light source. In some embodiments, the method further includes time-sequentially applying the first voltage signal to the M number of first voltage signal lines. In some embodiments, the method further includes time-sequentially applying the second voltage signal to the k number of second voltage signal lines. Optionally, the method includes time-sequentially applying the first voltage signal to the M number of first voltage signal lines; and time-sequentially applying the second voltage signal to the k number of second voltage signal lines.

In some embodiments, the respective one of the plurality of light emitting controlling units comprises a plurality of light emitting elements arranged in in rows and n columns, m is an integer equal to or greater than p, n is an integer equal to or greater than one. Optionally, a P-th sub-unit of the p number of sub-units comprises n columns of light emitting elements, $1 \leq P \leq p$, each of the n columns of light emitting elements comprising multiple rows of light emitting elements electrically connected in series. In some embodiments, the method further includes commonly connecting first terminals of the n columns of light emitting elements in the P-th sub-unit to a P-th first voltage branch signal line of the p number of first voltage branch signal lines; and connecting a respective second terminal of second terminals of the n columns of light emitting elements in the P-th sub-unit to one of the k number of second voltage branch signal lines in a P-th group of the p number of groups of second voltage branch signal lines.

In some embodiments, the method further includes time-sequentially applying the first voltage signal to the M number of first voltage signal lines; and during a period in which the first voltage signal is applied to the respective one of the M number of first voltage signal lines, time-sequentially applying the second voltage signal to the k number of second voltage signal lines in the respective one of the plurality of light emitting controlling units. Optionally, the first voltage signal is simultaneously applied to the p number of first voltage branch signal lines during the period in which the first voltage signal to the respective one of the M number of first voltage signal lines; and during a period in which the second voltage signal is applied to a K-th second voltage signal line of the k number of second voltage signal lines, the second voltage signal is simultaneously applied to K-th second voltage branch signal lines of the k number of second voltage branch signal lines in all of the p number of groups of second voltage branch signal lines, $1 \leq K \leq k$. Optionally, the first voltage signal is simultaneously applied to the first terminals of the p number of sub-units respectively through the p number of first voltage branch signal lines, during the period in which the first voltage signal is applied to the respective one of the M number of first voltage signal lines; and during a period in which the second voltage signal is applied to the K-th second voltage signal line of the k number of second voltage signal lines, the second voltage signal is simultaneously applied to second terminals that are connected to the K-th second voltage branch signal lines of the k number of second voltage branch signal lines, the second terminals that are connected to the K-th second voltage branch signal lines being respectively from the p number of sub-units.

In some embodiments, the multiple rows of light emitting elements in a respective one of the n columns of light emitting elements comprises light emitting elements of a same color; the respective one of the n columns of light emitting elements comprises light emitting elements of a K-th color of k number of different colors, $1 \leq K \leq k$; and light emitting elements in (n/k) number of columns out of the n columns of light emitting elements are of the K-th color. In some embodiments, the method further includes commonly connecting second terminals of the (n/k) number of columns out of the n columns of light emitting elements to a K-th second voltage branch signal line of the k number of second voltage branch signal lines in the P-th group of the p number of groups of second voltage branch signal lines, $1 \leq K \leq k$. Optionally, the method further includes time-sequentially applying the second voltage signal to k groups of columns of light emitting elements, each of the k groups of columns of light emitting elements comprising (n/k) number of columns out of the n columns of light emitting elements, light emitting elements in a same group of the k groups of columns of light emitting elements being of a same color.

In some embodiments, is a (x*p), n is a (y*k), wherein x is an integer greater than one, and y is an integer greater than one; the n columns of light emitting elements in the P-th sub-unit comprise y groups of columns; a Y-th group of the y groups of columns comprises k number of columns of light emitting elements respectively of k number of different colors, $1 \leq Y \leq y$; and color patterns in y groups of columns are same. For example, each group of the y groups includes three columns of light emitting elements respectively of three different colors. In one example, each group of the y groups includes three columns of light emitting elements respectively of red, green, and blue colors; and each group of the y groups has a same red-green-blue color pattern. In some embodiments, the method further includes time-sequentially applying the second voltage signal to the k number of columns of light emitting elements respectively of k number of different colors in the Y-th group.

Optionally, each of the n columns of light emitting elements comprises (m/p) rows of light emitting elements electrically connected in series.

Optionally, k=3.

Figure 5:
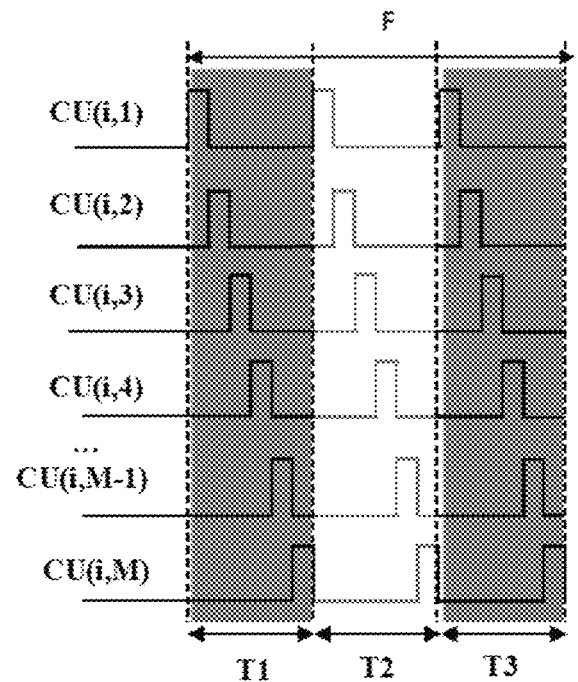
FIG. 5 is a timing diagram of driving a light emitting substrate in some embodiments according to the present disclosure.

FIG. 5 is a timing diagram of driving a light emitting substrate in some embodiments according to the present disclosure. Referring to FIG. 3 and FIG. 5, the method in some embodiments includes time-sequentially applying the first voltage signal to the M number of first voltage signal lines (P1 to PM); during a period in which the first voltage signal is applied to the respective one of the M number of first voltage signal lines, time-sequentially applying the second voltage signal to the k number of second voltage signal lines (in FIG. 6, k=3, representing red light emitting elements, green light emitting elements, and blue light emitting elements). Referring to FIG. 4 and FIG. 5, the first voltage signal is simultaneously applied to the p number of first voltage branch signal lines during the period in which the first voltage signal to the respective one of the M number of first voltage signal lines. During a period in which the second voltage signal is applied to a K-th second voltage signal line of the k number of second voltage signal lines, the second voltage signal is simultaneously applied to K-th second voltage branch signal lines of the k number of second voltage branch signal lines in all of the p number of groups of second voltage branch signal lines, $1 \leq K \leq k$.

In FIG. 5, T1, T2, T3 respectively represent light emitting durations respectively for light emitting elements of k different colors in the M number of light emitting controlling units. In one example, T1 represents light emitting duration for red light emitting elements, T2 represents light emitting duration for green light emitting elements, and T3 represents light emitting duration for blue light emitting elements. In another example, a sum of T1, T2, and T3 equals to a duration of a frame of image of a reflective display panel utilizing the light emitting substrate as a front-lit light source. In some embodiments, during the T1 duration, the first voltage signal is time-sequentially applied to the M number of light emitting controlling units, and the second voltage signal is time-sequentially applied to 1st second voltage signal lines respectively from the M number of groups of second voltage signal lines. The red light emitting elements in the M number of light emitting controlling units are configured to time-sequentially emit a red light during the T1 duration, light emitting controlling unit after light emitting controlling unit. In some embodiments, during the T2 duration, the first voltage signal is time-sequentially applied to the M number of light emitting controlling units, and the second voltage signal is time-sequentially applied to 2nd second voltage signal lines respectively from the M number of groups of second voltage signal lines. The green light emitting elements in the M number of light emitting controlling units are configured to time-sequentially emit a green light during the T2 duration, light emitting controlling unit after light emitting controlling unit. In some embodiments, during the T3 duration, the first voltage signal is time-sequentially applied to the M number of light emitting controlling units, and the second voltage signal is time-sequentially applied to 3rd second voltage signal lines respectively from the M number of groups of second voltage signal lines. The blue light emitting elements in the M number of light emitting controlling units are configured to time-sequentially emit a green light during the T3 duration, light emitting controlling unit after light emitting controlling unit.

Optionally, a 1st second voltage signal line in a first light emitting controlling unit of two adjacent light emitting controlling units is provided with the second voltage signal at a first time point Tn, and a 1st second voltage signal line in a second light emitting controlling unit of the two adjacent light emitting controlling units is provided with the second voltage signal at a second time point T(n+1). Optionally, a 2nd second voltage signal line in a first light emitting controlling unit of two adjacent light emitting controlling units is provided with the second voltage signal at a first time point Tn, and a 2nd second voltage signal line in a second light emitting controlling unit of the two adjacent light emitting controlling units is provided with the second voltage signal at a second time point T(n+1). Optionally, a 3rd second voltage signal line in a first light emitting controlling unit of two adjacent light emitting controlling units is provided with the second voltage signal at a first time point Tn, and a 3rd second voltage signal line in a second light emitting controlling unit of the two adjacent light emitting controlling units is provided with the second voltage signal at a second time point T(n+1).

Optionally, T(n+1)=Tn+D/M, wherein D is a total light emitting duration for light emitting elements of a same color. In one example, for red light emitting elements, T(n+1)=Tn+T1/M. In another example, for green light emitting elements, T(n+1)=Tn+T2/M. In another example, for blue light emitting elements, T(n+1)=Tn+T3/M. Optionally, T1=T2=T3, and (T1+T2+T3)=F. Optionally, (T1+T2+T3)=F, however, at least two of T1, T2, or T3 are different from each other.

In some embodiments, T1 . . . , TK, . . . , Tk respectively represent light emitting durations respectively for light emitting elements of k different colors in the M number of light emitting controlling units. In one example, a sum of T1 to Tk equals to a duration of a frame of image of a reflective display panel utilizing the light emitting substrate as a front-lit light source. In some embodiments, during the TK duration, the first voltage signal is time-sequentially applied to the M number of light emitting controlling units, and the second voltage signal is time-sequentially applied to K-th second voltage signal lines respectively from the M number of groups of second voltage signal lines. The light emitting elements of the K-th color in the M number of light emitting controlling units are configured to time-sequentially emit a red light during the T1 duration, light emitting controlling unit after light emitting controlling unit.

Optionally, a K-th second voltage signal line in a first light emitting controlling unit of two adjacent light emitting controlling units is provided with the second voltage signal at a first time point Tn, and a K-th second voltage signal line in a second light emitting controlling unit of the two adjacent light emitting controlling units is provided with the second voltage signal at a second time point T(n+1). Optionally, T(n+1)=Tn+TK/M.

In some embodiments, the reflective display panel includes a plurality of image display regions arranged in M rows and N columns, the plurality of image display regions respectively corresponding to the plurality of light emitting controlling units in the light emitting substrate. One or more subpixels in a respective one of the plurality of image display regions correspond to light emitting elements in a respective one of the plurality of light emitting controlling units.

Figure 6:
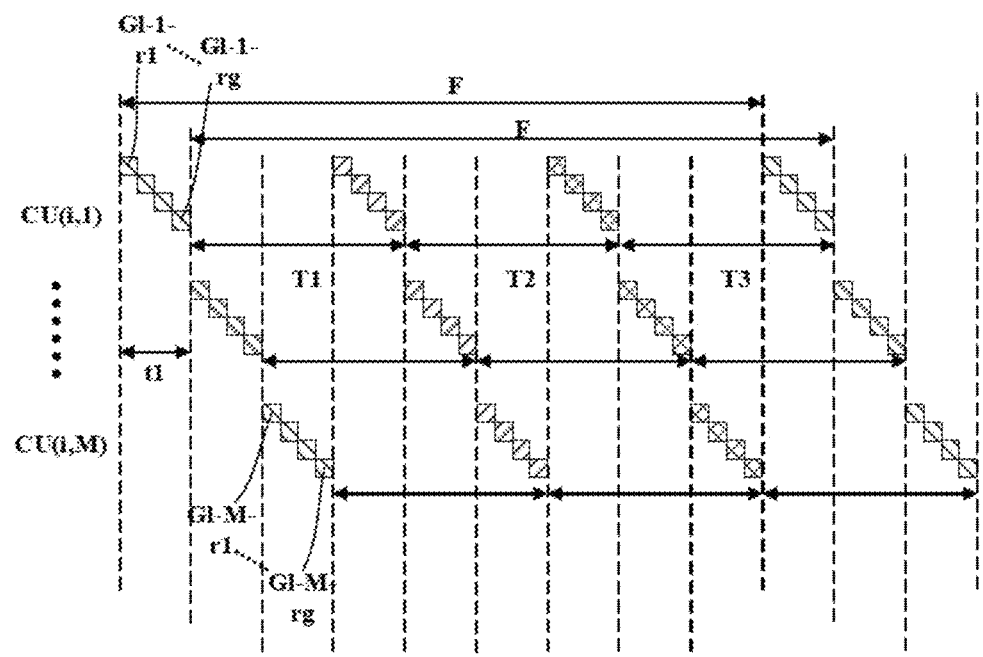
FIG. 6 in some embodiments is a timing diagram of driving a light emitting substrate and scanning gate lines of a reflective display panel utilizing the light emitting substrate in some embodiments according to the present disclosure.

FIG. 6 is a timing diagram of driving a light emitting substrate and scanning gate lines of a reflective display panel utilizing the light emitting substrate in some embodiments according to the present disclosure. Referring to FIG. 6, the M number of light emitting controlling units CU(i,1), . . . , CU(i, M) are denoted. Gate scanning signals are respectively provided to g number of gate lines G1-1-r1 to G1-1-rg corresponding to a first light emitting controlling unit CU(i, 1). Gate scanning signals are respectively provided to g number of gate lines G1-M-r1 to G1-M-rg corresponding to a M-th light emitting controlling unit CU(i, M). T1, T2, T3 denote light emitting durations respectively for light emitting elements of different colors.

In some embodiments, a method of driving a front-lit reflective display apparatus includes assembling a reflective display panel and a front lit light emitting substrate together, wherein the light emitting substrate comprises a plurality of light emitting controlling units arranged in M rows and N columns, M is an integer equal to or greater than one, N is an integer equal to or greater than one; respectively connecting M number of first voltage signal lines to M number of light emitting controlling units in a respective column of the N columns of light emitting controlling units; and connecting a respective group of M number of groups of second voltage signal lines to a respective one of the M number of light emitting controlling units, the respective group of the M number of groups of second voltage signal lines comprising k number of second voltage signal lines, k is an integer equal to or greater than one, wherein the respective one of the plurality of light emitting controlling units comprises p number of sub-units, p is an integer equal to or greater than one; respectively connecting p number of first voltage branch signal lines to the p number of sub-units; respectively electrically connecting k number of second voltage branch signal lines to the k number of second voltage signal lines in the respective group of the M number of groups of second voltage signal lines, providing a second voltage signal to p number of groups of second voltage branch signal lines, a respective group of the p number of groups of second voltage branch signal lines comprising the k number of second voltage branch signal lines; electrically connecting the p number of first voltage branch signal lines to a respective one of the M number of first voltage signal lines; time-sequentially applying a first voltage signal to the M number of first voltage signal lines; during a period in which the first voltage signal is applied to the respective one of the M number of first voltage signal lines, time-sequentially applying the second voltage signal to the k number of second voltage signal lines; the first voltage signal is simultaneously applied to the p number of first voltage branch signal lines during the period in which the first voltage signal to the respective one of the M number of first voltage signal lines; during a period in which the second voltage signal is applied to a K-th second voltage signal line of the k number of second voltage signal lines, the second voltage signal is simultaneously applied to K-th second voltage branch signal lines of the k number of second voltage branch signal lines in all of the p number of groups of second voltage branch signal lines, 1≤K≤k.

In some embodiments, the method further includes applying gate scanning signals respectively to g number of gate lines corresponding to a respective first voltage signal line to turn on subpixels corresponding to light emitting elements connected to the K-th second voltage branch signal lines of the k number of second voltage branch signal lines in all of the p number of groups of second voltage branch signal lines. Optionally, as shown in FIG. 6, applying the first voltage signal to the respective one of the M number of first voltage signal lines and applying the second voltage signal to the K-th second voltage branch signal lines of the k number of second voltage branch signal lines in all of the p number of groups of second voltage branch signal lines are performed subsequent to applying gate scanning signals respectively to the g number of gate lines corresponding to a respective first voltage signal line; wherein gate scanning signals are applied to turn on subpixels corresponding to light emitting elements connected to the K-th second voltage branch signal lines of the k number of second voltage branch signal lines in all of the p number of groups of second voltage branch signal lines. Optionally, as shown in FIG. 6, the method further includes applying gate scanning signals respectively to the g number of gate lines corresponding to a respective first voltage signal line to turn on subpixels corresponding to light emitting elements connected to a (K+1)-th second voltage branch signal lines of the k number of second voltage branch signal lines in all of the p number of groups of second voltage branch signal lines; and upon completion of applying gate scanning signals respectively to the g number of gate lines to turn on subpixels corresponding to light emitting elements connected to the (K+1)-th second voltage branch signal lines, applying the first voltage signal to the respective one of the M number of first voltage signal lines and applying the second voltage signal to the (K+1)-th second voltage branch signal lines of the k number of second voltage branch signal lines in all of the p number of groups of second voltage branch signal lines.

In one example, once the gate scanning signals are provided to the g number of gate lines corresponding to a respective first voltage signal line to turn on subpixels corresponding to light emitting elements connected to the K-th second voltage branch signal lines of the k number of second voltage branch signal lines in all of the p number of groups of second voltage branch signal lines, the light emitting elements of a first color (e.g., red light emitting elements) in the light emitting substrate controlled by the respective first voltage signal line are configured to emit light (e.g., red light) for a light emitting duration (e.g., T1 for red light emitting elements). Once the gate scanning signals are provided to the g number of gate lines corresponding to a respective first voltage signal line to turn on subpixels corresponding to light emitting elements connected to the (K+1)-th second voltage branch signal lines of the k number of second voltage branch signal lines in all of the p number of groups of second voltage branch signal lines, the light emitting elements of a second color (e.g., green light emitting elements) in the light emitting substrate controlled by the respective first voltage signal line are configured to emit light (e.g., green light) for a light emitting duration (e.g., T2 for green light emitting elements). Once the gate scanning signals are provided to the g number of gate lines corresponding to a respective first voltage signal line to turn on subpixels corresponding to light emitting elements connected to the (K+2)-th second voltage branch signal lines of the k number of second voltage branch signal lines in all of the p number of groups of second voltage branch signal lines, the light emitting elements of a third color (e.g., blue light emitting elements) in the light emitting substrate controlled by the respective first voltage signal line are configured to emit light (e.g., blue light) for a light emitting duration (e.g., T3 for blue light emitting elements). In one example, the reflective display panel is a reflective liquid crystal display panel. By having the present driving method, light emission starts when the liquid crystal has not yet completed the response. Because light emission duration is elongated, a higher luminance in the reflective display panel may be achieved.

In some embodiments, the reflective display panel is a high frequency type reflective liquid crystal display panel. In this type of display panel, a frame of image is much shorter. Once gate signal scanning in a region of the reflective display panel (e.g., a region corresponding to a respective first voltage signal line in the light emitting substrate), the corresponding light emitting elements in the light emitting substrate are turned on to emit light. In this manner, light emission duration is elongated, a higher luminance in the reflective display panel may be achieved without higher energy consumption.

In one example, a scanning duration for scanning one row of light emitting elements in the reflective display panel is t0, a total scanning duration for scanning the m number of rows of light emitting elements in the reflective display panel is t1 (as denoted in FIG. 6), wherein t1=m×t0. In another example, a first starting time point for providing gate scanning signals to the m number of rows of light emitting elements in the reflective display panel corresponding to a first voltage signal line Pn is denoted as Tn, a second starting time point for providing gate scanning signals to the m number of rows of light emitting elements in the reflective display panel corresponding to a first voltage signal line P(n+1) is denoted as T(n+1); the time difference between Tn and T(n+1) is t1.

In one example, the initial time point of a frame of image is ti. At the end of ti, scanning of g number of gate lines corresponding to the 1st one of the M number of light emitting controlling unit begins. A duration for scanning g number of gate lines corresponding to the 1st one of the M number of light emitting controlling unit is t1. At the end of (ti+t1), all red light emitting elements in the 1st one of the M number of light emitting controlling unit are configured to emit red light for a duration of T1. At the end of (ti+t1), scanning of g number of gate lines corresponding to the 2nd one of the M number of light emitting controlling unit begins. A duration for scanning the g number of gate lines corresponding to the 2nd one of the M number of light emitting controlling unit is t1. At the end of (ti+2t1), all red light emitting elements in the 2nd one of the M number of light emitting controlling unit are configured to emit red light for a duration of T1. At the end of (ti+2t1), scanning of g number of gate lines corresponding to the 3rd one of the M number of light emitting controlling unit begins. A duration for scanning the g number of gate lines corresponding to the 3rd one of the M number of light emitting controlling unit is t1. At the end of (ti+3t1), all red light emitting elements in the 3rd one of the M number of light emitting controlling unit are configured to emit red light for a duration of T1. Similarly, At the end of (ti+Mxt1), all red light emitting elements in the m-th one of the M number of light emitting controlling unit are configured to emit red light for a duration of T1.

At the end of (ti+Mxt1), scanning of g number of gate lines corresponding to the 1st one of the M number of light emitting controlling unit begins. A duration for scanning g number of gate lines corresponding to the 1st one of the M number of light emitting controlling unit is t1. At the end of (ti+Mxt1+t1), all green light emitting elements in the 1st one of the M number of light emitting controlling unit are configured to emit green light for a duration of T2. At the end of (ti+Mxt1+t1), scanning of g number of gate lines corresponding to the 2nd one of the M number of light emitting controlling unit begins. A duration for scanning the g number of gate lines corresponding to the 2nd one of the M number of light emitting controlling unit is t1. At the end of (ti+Mxt1+2t1), all green light emitting elements in the 2nd one of the M number of light emitting controlling unit are configured to emit red light for a duration of T2. At the end of (ti+Mxt1+2t1), scanning of g number of gate lines corresponding to the 3rd one of the M number of light emitting controlling unit begins. A duration for scanning the g number of gate lines corresponding to the 3rd one of the M number of light emitting controlling unit is t1. At the end of (ti+Mxt1+3t1), all green light emitting elements in the 3rd one of the M number of light emitting controlling unit are configured to emit red light for a duration of T2. Similarly, At the end of (ti+Mxt1+Mxt1), all green light emitting elements in the m-th one of the M number of light emitting controlling unit are configured to emit green light for a duration of T1.

At the end of (ti+2Mxt1), scanning of g number of gate lines corresponding to the 1st one of the M number of light emitting controlling unit begins. A duration for scanning g number of gate lines corresponding to the 1st one of the M number of light emitting controlling unit is t1. At the end of (ti+2Mxt1+t1), all blue light emitting elements in the 1st one of the M number of light emitting controlling unit are configured to emit blue light for a duration of T3. At the end of (ti+2Mxt1+t1), scanning of g number of gate lines corresponding to the 2nd one of the M number of light emitting controlling unit begins. A duration for scanning the g number of gate lines corresponding to the 2nd one of the M number of light emitting controlling unit is t1. At the end of (ti+2Mxt1+2t1), all blue light emitting elements in the 2nd one of the M number of light emitting controlling unit are configured to emit blue light for a duration of T3. At the end of (ti+2Mxt1+2t1), scanning of g number of gate lines corresponding to the 3rd one of the M number of light emitting controlling unit begins. A duration for scanning the g number of gate lines corresponding to the 3rd one of the M number of light emitting controlling unit is t1. At the end of (ti+2Mxt1+3t1), all blue light emitting elements in the 3rd one of the M number of light emitting controlling unit are configured to emit blue light for a duration of T3. Similarly, At the end of (ti+2Mxt1+Mxt1), all blue light emitting elements in the m-th one of the M number of light emitting controlling unit are configured to emit blue light for a duration of T3.

Comparing FIG. 5 and FIG. 6, the individual light emitting element in FIG. 5 is configured to emit light for a shorter period of time. In FIG. 5, a total light emitting duration of light emitting elements of a same color in the M number of light emitting controlling units is T1, whereas, in FIG. 6, a total light emitting duration of light emitting elements of a same color in a respective one of the M number of light emitting controlling units is T1. The driving method depicted in FIG. 5 requires a larger driving current in order to achieve a same luminance as the driving method shown in FIG. 6. In one example, the driving method shown in FIG. 5 adopts a pulse width regulating scheme.

Figure 7:
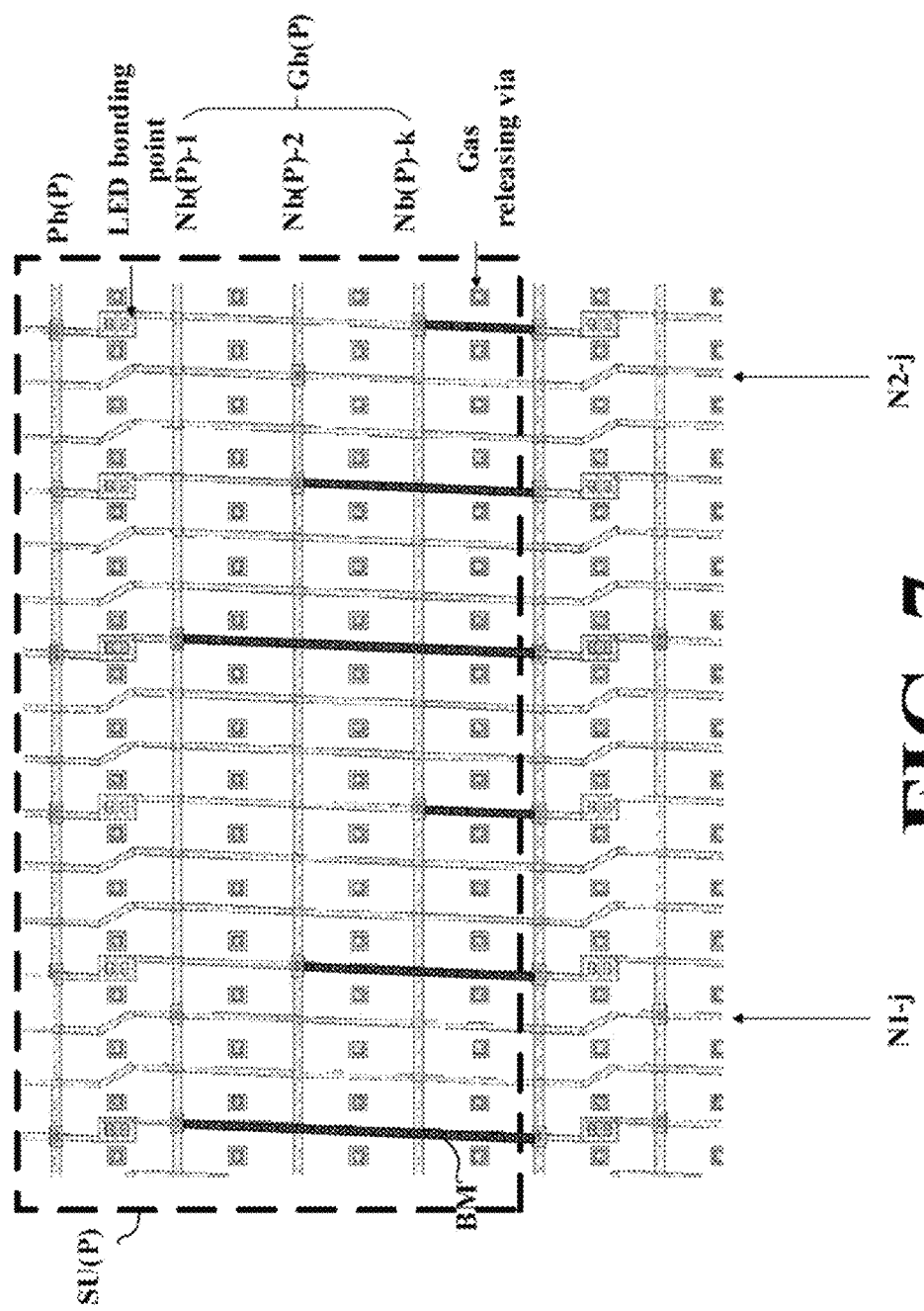
FIG. 7 is a schematic diagram illustrating the structure of a light emitting controlling unit in a light emitting substrate in some embodiments according to the present disclosure.
Figure 8:
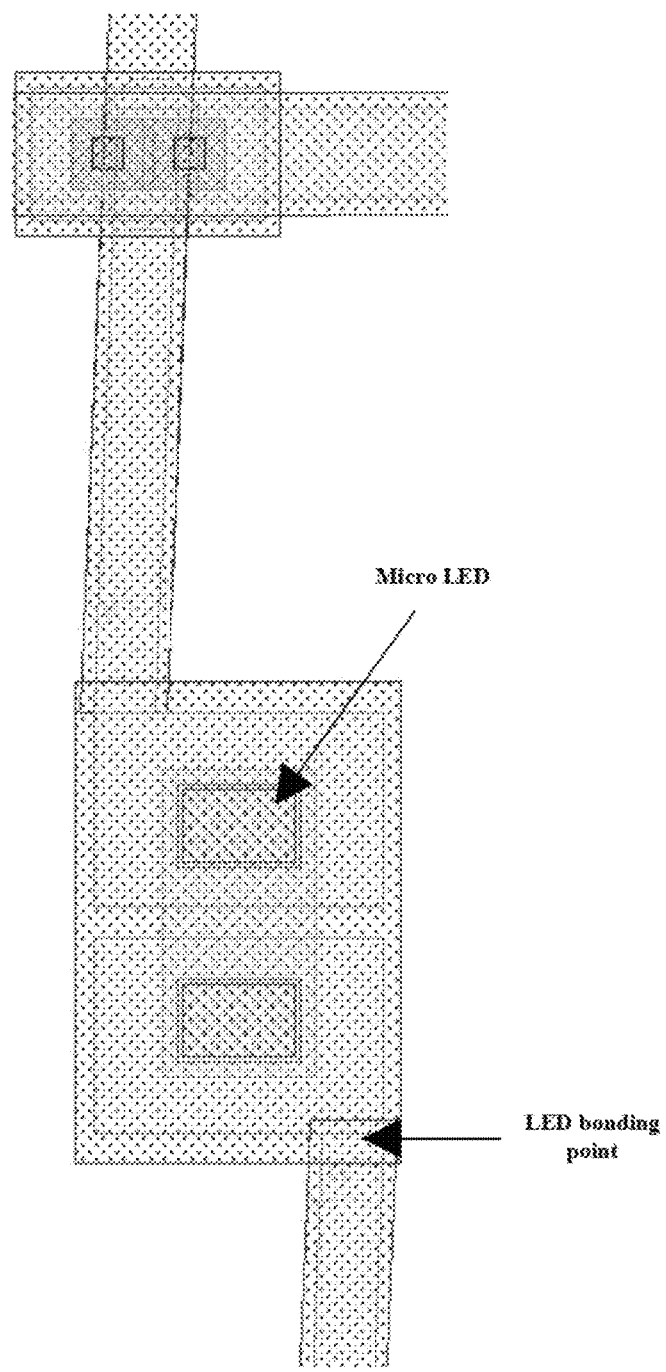
FIG. 8 is a zoom-in view of a LED bonding point in FIG. 7.

FIG. 7 is a schematic diagram illustrating the structure of a light emitting controlling unit in a light emitting substrate in some embodiments according to the present disclosure. FIG. 7 is a zoom-in view of FIG. 4. Referring to FIG. 7, the light emitting controlling unit includes an array of 2×2 micro LEDs. Optionally, the array includes 2×2 red micro LEDs, 2×2 green micro LEDs, and 2×2 blue micro LEDs. As shown in FIG. 7, light emitting elements in the P-th sub-unit SU(P) are commonly connected to a P-th first voltage branch signal line Pb(P). In the P-th sub-unit SU(P), micro LEDs of a same color are commonly connected to a same second voltage signal lines. In one example, red light emitting elements are commonly connected to the second voltage signal line N1-$j$, green light emitting elements are commonly connected to the second voltage signal line N2-$j$, and blue light emitting elements are commonly connected to a same second voltage signal line. Referring to FIG. 7, the light emitting substrate in some embodiments further includes at least one gas releasing via to prevent gas defect during a high temperature manufacturing process. A LED bonding point is also shown in FIG. 7. FIG. 8 is a zoom-in view of a LED bonding point in FIG. 7.

Figure 9:
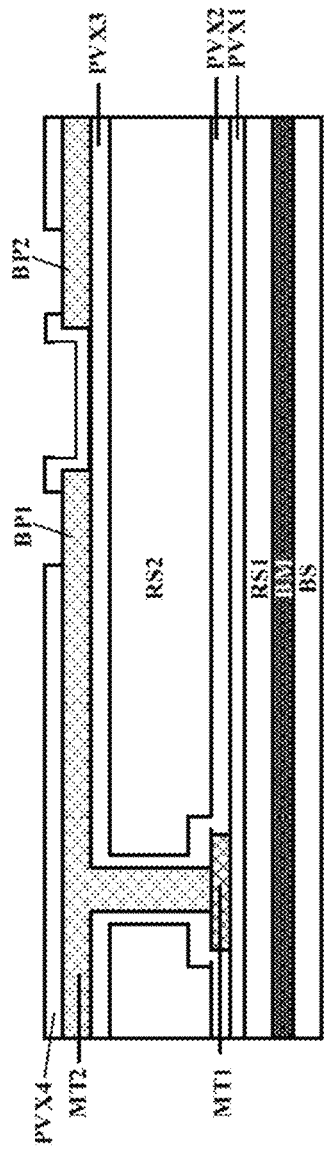
FIG. 9 is a schematic diagram illustrating the structure of a back plate for bonding micro LED of a light emitting substrate in some embodiments according to the present disclosure.

FIG. 9 is a schematic diagram illustrating the structure of a back plate for bonding micro LED of a light emitting substrate in some embodiments according to the present disclosure. Referring to FIG. 9, the back plate in some embodiments includes a base substrate BS, a black matrix BM on the base substrate BS, a first resin layer RSI on a side of the black matrix BM away from the base substrate BS, a first passivation layer PVX1 on a side of the first resin layer RS1 away from the base substrate BS, a first metal layer MT1 on a side of the first passivation layer PVX1 away from the base substrate BS, a second passivation layer PVX2 on a side of the first metal layer MT1 and the first passivation layer PVX1 away from the base substrate BS, a second resin layer RS2 on a side of the second passivation layer PVX2 away from the base substrate BS, a third passivation layer PVX3 on a side of the second resin layer RS2 away from the base substrate BS, a second metal layer MT2 on a side of the third passivation layer PVX3 away from the base substrate BS, and a fourth passivation layer PVX4 on a side of the second metal layer MT2 away from the base substrate BS. The second metal layer MT2 connects to the first meal layer MT through a via extending through the third passivation layer PVX3, the second resin layer RS2, and the second passivation layer PVX2.

In some embodiments, the light emitting substrate includes a base substrate BS, a black matrix BM on the base substrate BS; a first metal layer MTI and a second metal layer MT2 on a side of the black matrix BM away from the base substrate BS; and at least one insulating layer spacing apart the first metal layer MTI from the second metal layer MT2. Orthographic projections of the first metal layer MTI and the second metal layer MT1 on the base substrate BS are within an orthographic projection of the black matrix BM on the base substrate BS. Optionally, the black matrix BM is limited in a region having bonding pads. Optionally, orthographic projections of all metal layers on the base substrate BS are within the orthographic projection of the black matrix BM on the base substrate BS.

In some embodiments, the light emitting substrate further includes a first resin layer RSI between the black matrix BM and the first metal layer MTI. Optionally, the at least one insulating layer includes a second resin layer RS2.

In some embodiments, the light emitting substrate further includes a first passivation layer PVX1 between the first resin layer RSI and the first metal layer MTI. Optionally, the at least one insulating layer further includes a second passivation layer PVX2 between the second resin layer RS2 and the first metal layer MTI, and a third passivation layer PVX3 between the second resin layer RS2 and the second metal layer MT2.

In some embodiments, the light emitting substrate further includes a fourth passivation layer PVX4 on a side of the second metal layer MT2 away from the base substrate BS; and at least two vias extending through the fourth passivation layer PVX4 and partially exposing a surface of the second metal layer MT2. Optionally, the light emitting substrate further includes a plurality of first gas releasing vias arranged in a first array and a plurality of second gas releasing vias arranged in a second array.

Portions of the second metal layer MT2 can serve as a first bonding pad BPI and a second bonding pad BP2 for bonding a micro LED. In one example, the first metal layer MTI and the second metal layer MT2 are made of copper or copper-containing metallic material. On top of the first bonding pad BPI and the second bonding pad BP2, in some embodiments, nickel gold may be formed using a nickelized gold process, and subsequently indium metal may be plated on top of the nickel gold. Typically, the micro LED electrode is made of a gold material, which has an excellent bonding affinity with the indium material on the first bonding pad BP1 and the second bonding pad BP2.

In some embodiments, each of the first metal layer MT1 and the second metal layer MT2 includes copper. Optionally, the second metal layer MT2 further includes nickel gold on the surface partially exposed by the at least two vias. Optionally, the second metal layer MT2 further includes indium tin oxide on the surface partially exposed by the at least two vias.

A front light source is placed on top of a reflective-type display panel. To prevent reduction of image display contrast due to light reflection of ambient light on the metal layers, a black matrix is formed to shield ambient light from irradiating on the first metal layer MT1 or the second metal layer MT2. The presence of the first resin layer RS1 prevents contamination of the CVD chamber by a black matrix material volatilization during deposition of a material of the first passivation layer PVX1. The presence of the first passivation layer PVX1 prevents oxidation of the first metal layer MT1 by the first resin layer RS1. Similarly, the second passivation layer PVX2 and the third passivation layer PVX3 prevent oxidation of the first meal layer MT1 or the second metal layer MT2 by the second resin layer RS2. The second resin layer RS2 can reduce overall load of the front light source by reducing coupling capacitance between the first metal layer MT1 and the second metal layer MT2. The fourth passivation layer PVX4 prevents bubbling of electrode material (e.g., the second metal layer MT2) in the front light source.

In some embodiments, the back plate further includes an indium tin oxide layer on a side of the fourth passivation layer PVX4 and the second metal layer MT2 away from the base substrate BS. The indium tin oxide layer is used for bonding a flexible printed circuit. The fourth passivation layer PVX4 prevents surface fogging of the indium tin oxide layer.

Figure 10:
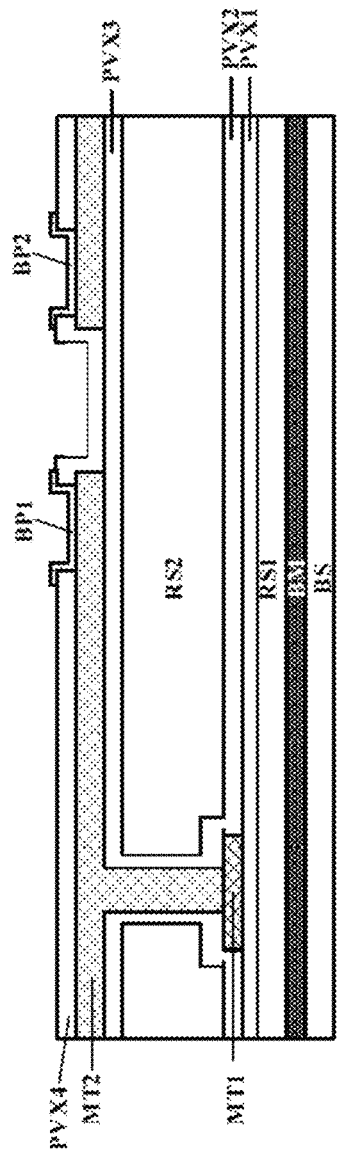
FIG. 10 is a schematic diagram illustrating the structure of a back plate for bonding micro LED of a light emitting substrate in some embodiments according to the present disclosure.

FIG. 10 is a schematic diagram illustrating the structure of a back plate for bonding micro LED of a light emitting substrate in some embodiments according to the present disclosure. Referring to FIG. 10, the back plate includes a first bonding pad BP1 and a second bonding pad BP2 made of indium tin oxide. The first bonding pad BP1 and the second bonding pad BP2 are respectively connected to the second metal layer MT2 respectively through vias extending through the fourth passivation layer PVX4.

Figure 11A:
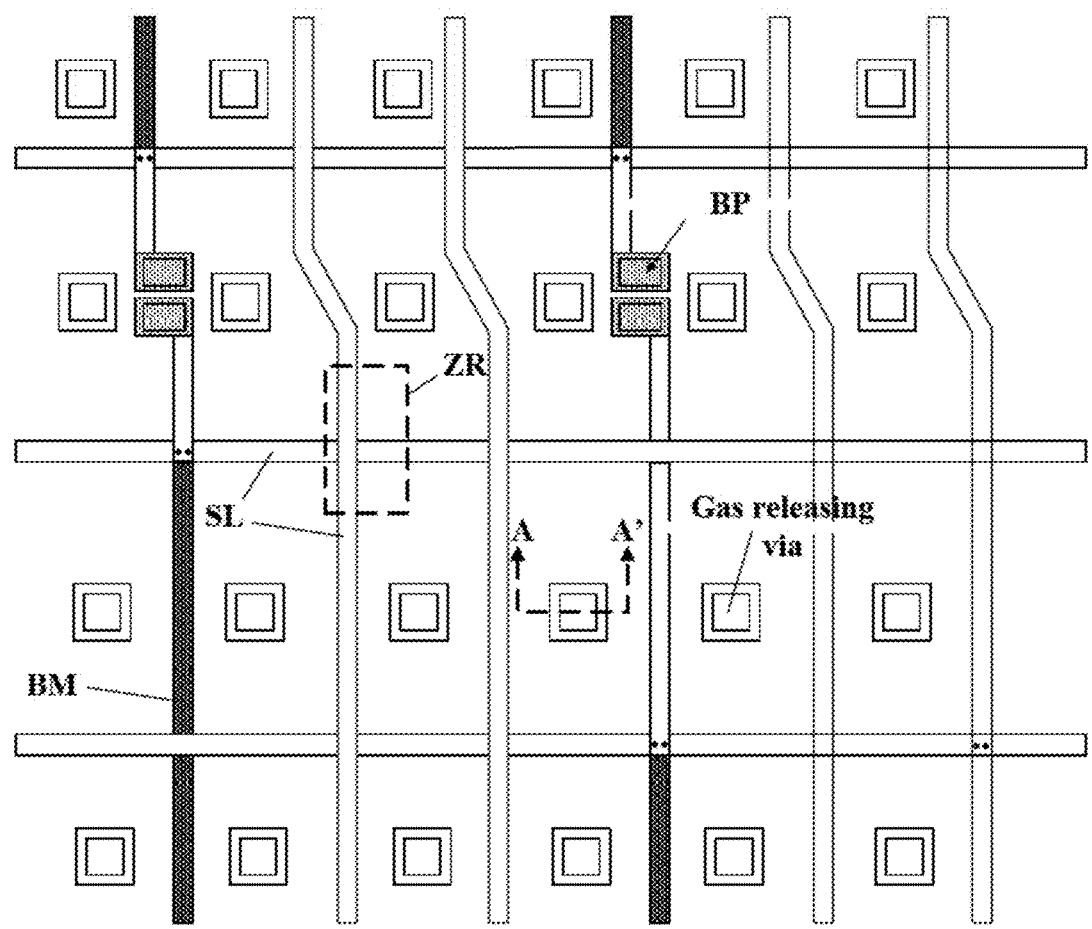
FIG. 11A is a schematic diagram illustrating a signal line layer and a black matrix layer in a light emitting substrate in some embodiments according to the present disclosure.

FIG. 11A is a schematic diagram illustrating a signal line layer and a black matrix layer in a light emitting substrate in some embodiments according to the present disclosure. Referring to FIG. 11A, at least one of the signal lines SL along the column direction (for example, the k number of second voltage signal lines or signal lines for connecting adjacent bonding pad BP) may not extend all the way through the column direction. The light emitting substrate in some embodiments further includes a black matrix BM in places where the signal line is missing. In some embodiments, the black matrix BM and the signal lines have a structure so that an orthographic projection of a combination of the black matrix BM and the signal lines on the base substrate is a grid, optionally, a grid of a substantially uniform density. By having this structure, the optical permeability of the light emitting substrate is more uniform. Luminance performance of the light emitting substrate, particularly when used as a front-lit light for a reflective display panel, is more uniform throughout the entire light emitting area. A better blanking effect may be achieved in a grid with evenly distributed black matrix lines and metal lines, further eliminating any adverse effect caused by the metal lines. In FIG. 11A, the light emitting substrate includes a plurality of rows of gas releasing vias, a respective row being between two adjacent signal lines of the signal lines SL extending along a row direction.

Figure 11B:
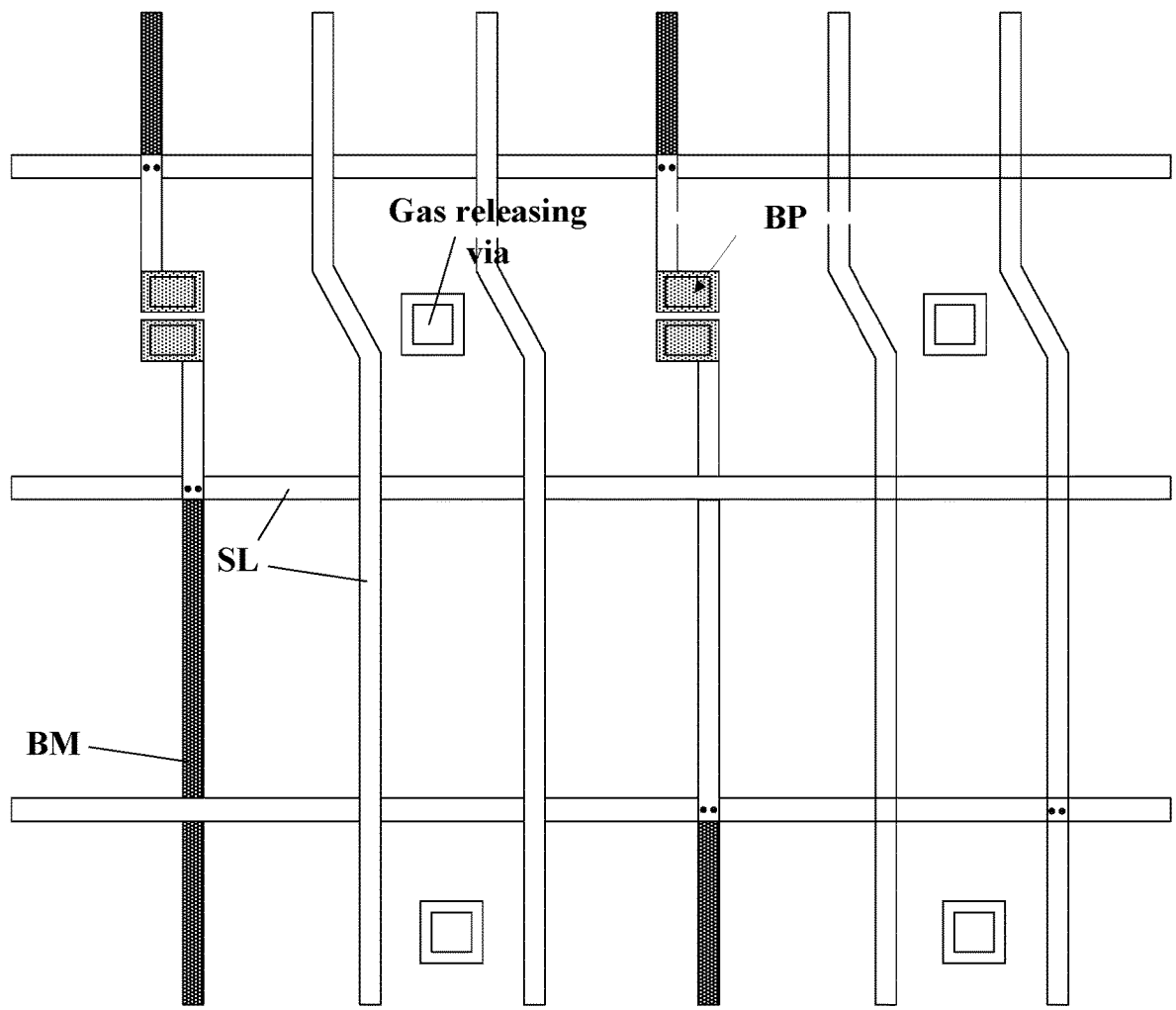
FIG. 11B is a schematic diagram illustrating a signal line layer and a black matrix layer in a light emitting substrate in some embodiments according to the present disclosure.

FIG. 11B is a schematic diagram illustrating a signal line layer and a black matrix layer in a light emitting substrate in some embodiments according to the present disclosure. Referring to FIG. 11B, the gas releasing vias are arranged in a plurality of rows, two adjacent rows of the gas releasing vias are spaced apart by in number of adjacent signal lines of the signal lines SL extending along a row direction, m≥2. Optionally, in =2. Similarly, the gas releasing vias are arranged in a plurality of columns, two adjacent columns of the gas releasing vias are spaced apart by n number of adjacent signal lines of the signal lines SL extending along a column direction, n≥2. Optionally, n=2.

Similarly, in some embodiments, at least one of the signal lines SL along the row direction (for example, first voltage branch signal lines, second voltage branch signal lines) may not extend all the way through the row direction. The black matrix BM may be provided in places where the signal line is missing. In some embodiments, the black matrix BM and the signal lines have a structure so that an orthographic projection of a combination of the black matrix BM and the signal lines on the base substrate is a grid, optionally, a grid of a substantially uniform density.

Referring to FIGS. 9, 10, and 11, the signal lines along the row direction may be a part of the second metal layer MT2, and the signal lines along the column direction may be a part of the first metal layer MT1.

Referring to FIG. 7, in some embodiments, the metal lines along the row direction and the metal lines (or black matrix lines) along the column direction cross over each other at an angle that is not 90 degrees. Typically, the metal lines in the reflective display panel respectively along the row direction and along the columns are perpendicular to each other. By having the metal lines in the light emitting substrate along the row direction and the metal lines along the column direction cross over each other at an angle that is not 90 degrees, Moire pattern can be avoided or reduced.

In one example, the metal lines along the row direction in the light emitting substrate are substantially parallel to the metal lines along the row direction in the reflective display panel; whereas the metal lines along the column direction in the light emitting substrate are not parallel to the metal lines along the column direction in the reflective display panel (e.g., at an angle that is not zero).

In another example, the metal lines along the column direction in the light emitting substrate are substantially parallel to the metal lines along the column direction in the reflective display panel; whereas the metal lines along the row direction in the light emitting substrate are not parallel to the metal lines along the row direction in the reflective display panel (e.g., at an angle that is not zero).

In some embodiments, the light emitting substrate includes a plurality of signal lines (e.g., the signal lines SL in FIG. 11A or FIG. 11B). In some embodiments, the plurality of signal lines includes multiple signal lines extending along a first direction and multiple signal lines extending along a second direction, the second direction being different from the first direction. Optionally, the multiple signal lines extending along the first direction are parts of one of the first metal layer MT1 and the second metal layer MT2. Optionally, the multiple signal lines extending along the second direction are parts of another of the first metal layer MT1 and the second metal layer MT2.

In some embodiments, the black matrix BM includes multiple first black matrix lines extending along the first direction and multiple second black matrix lines extending along the second direction. Optionally, an orthographic projections of a combination of the black matrix BM and the plurality of signal lines on the base substrate BS is a grid. Optionally, dimensions of the multiple first black matrix lines along the first direction are the same. Optionally, dimensions of the multiple second black matrix lines along the second direction are the same. Optionally, orthographic projections of the multiple signal lines extending along the first direction on the base substrate are within orthographic projections of the multiple first black matrix lines on the base substrate. Optionally, orthographic projections of the multiple signal lines extending along the second direction on the base substrate are within orthographic projections of the multiple second black matrix lines on the base substrate.

In some embodiments, the multiple first black matrix lines are arranged along the second direction, the multiple second black matrix lines are arranged along the first direction. Optionally, any two adjacent first black matrix lines of the multiple first black matrix lines are spaced apart by a same distance along the second direction. Optionally, any two adjacent second black matrix lines of the multiple second black matrix lines are spaced apart by a same distance along the first direction. Optionally, a line width of a respective one of the plurality of signal lines along the first direction is smaller than a line width of black matrix lines along the first direction. Optionally, a line width of a respective one of the plurality of signal lines along the second direction is smaller than a line width of black matrix lines along the second direction.

In some embodiments, the multiple signal lines extending along the first direction comprise second voltage signal lines. Optionally, the multiple signal lines extending along the second direction comprise first voltage branch signal lines and second voltage branch signal lines.

Figure 12:
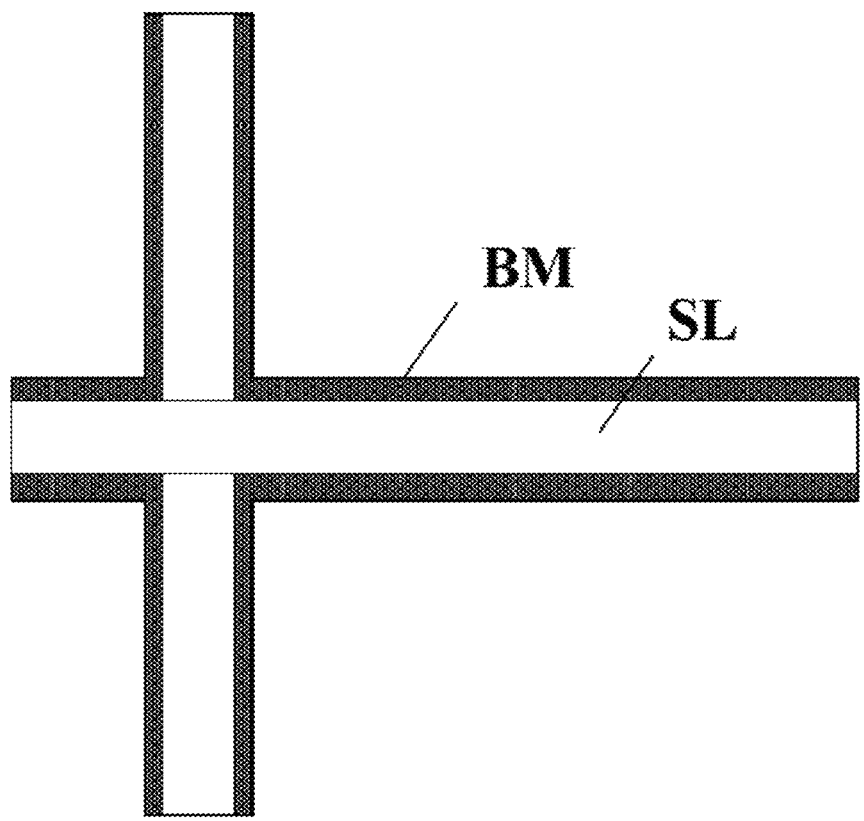
FIG. 12 is a zoom-in view of a zoom-in region of FIG. 11A.

FIG. 12 is a zoom-in view of a zoom-in region of FIG. 11A. Referring to FIG. 12, in some embodiments, the black matrix BM is also disposed wherein a signal line SL is disposed. Optionally, an orthographic projection of the black matrix BM on the base substrate covers an orthographic projection of the signal line SL. In one example, the orthographic projection of the signal line SL is within the orthographic projection of the black matrix BM. In another example, a dimension of the signal line SL along the row direction is smaller than a dimension of the black matrix BM along the row direction; and a dimension of the signal line SL along the column direction is smaller than a dimension of the black matrix BM along the column direction.

Figure 13:
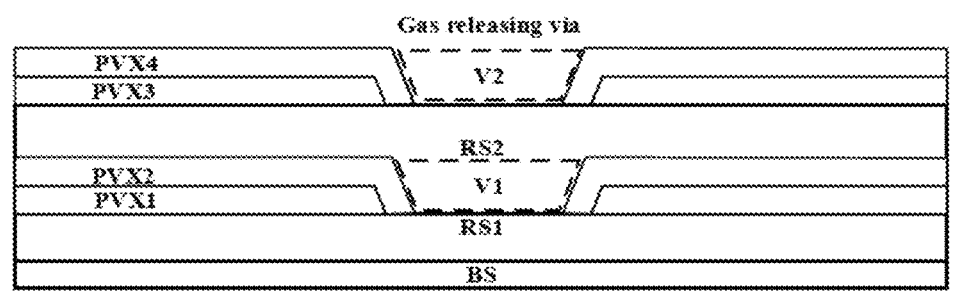
FIG. 13 is a cross-sectional view along an A-A' line in FIG. 11A.

FIG. 13 is a cross-sectional view along an A-A' line in FIG. 11A. Referring to FIG. 13, the gas releasing via in some embodiments includes a first gas releasing via V1 and a second gas releasing via V2. The first gas releasing via V1 extends through the first passivation layer PVX1 and the second passivation layer PVX2, exposing a surface of the first resin layer RS1. The second resin layer RS2 extends into the first gas releasing via V1. The second gas releasing via V2 extends through the third passivation layer PVX3 and the fourth passivation layer PVX4, exposing a surface of the second resin layer RS2. The first resin layer RS1 and the second resin layer RS2 optionally are made of an organic material, prone to release gas during a high-temperature process. The first passivation layer PVX1, the second passivation layer PVX2, the third passivation layer PVX3, and the fourth passivation layer PVX4 optionally are made of an inorganic material. Without the gas releasing via, the gas released by the first resin layer RS1 and the second resin layer RS2 may cause burst in one or more of the passivation layers, resulting in rupture. In the present light emitting substrate, orthographic projections of the first gas releasing via V1 and the second gas releasing via V2 on the base substrate at least partially overlap with each other, for example, the first gas releasing via V1 and the second gas releasing via V2 are aligned in a vertical direction (direction perpendicular to the substrate). Optionally, the light emitting substrate includes a plurality of first gas releasing vias arranged in a first array and a plurality of second gas releasing vias arranged in a second array. The particular structure facilitates releasing of gas produced by the resin layers.

Figure 14:
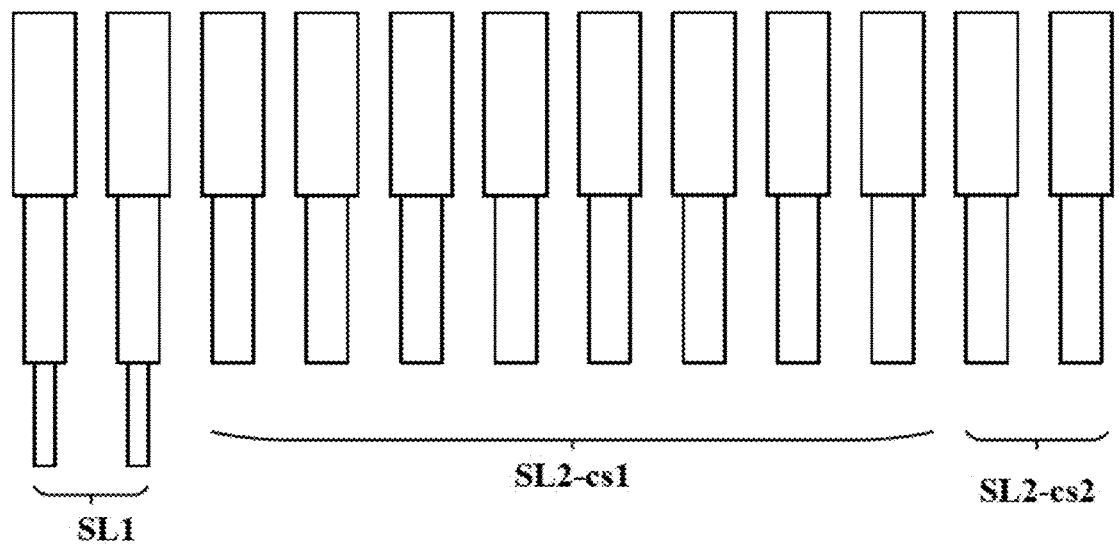
FIG. 14 illustrates an arrangement of signal lines along a peripheral area of a light emitting substrate in some embodiments according to the present disclosure.

FIG. 14 illustrates an arrangement of signal lines along a peripheral area of a light emitting substrate in some embodiments according to the present disclosure. Referring to FIG. 14, in the peripheral area, the light emitting substrate includes first voltage signal lines SL1 (e.g., any one or more of the M number of first voltage signal lines include P1, . . . , Pj, . . . , PM for any one or more of the plurality of light emitting controlling units CU(i, j)), and second voltage signal lines (e.g., any one or more second voltage signal line in any one or more group of the M number of groups of second voltage signal lines G1, . . . Gj, . . . . GM). In some embodiments, the second voltage signal lines for providing second voltage to light emitting elements of a same color are arranged adjacent to each other. In one example, as shown in FIG. 14, second voltage signal lines SL2-cs1 for providing second voltage to light emitting elements of a first color are arranged adjacent to each other, and second voltage signal lines SL2-cs2 for providing second voltage to light emitting elements of a second color are arranged adjacent to each other, and so on. In another example, second voltage signal lines for providing second voltage to light emitting elements in a same light emitting controlling unit are arranged adjacent to each other.

Figure 15:
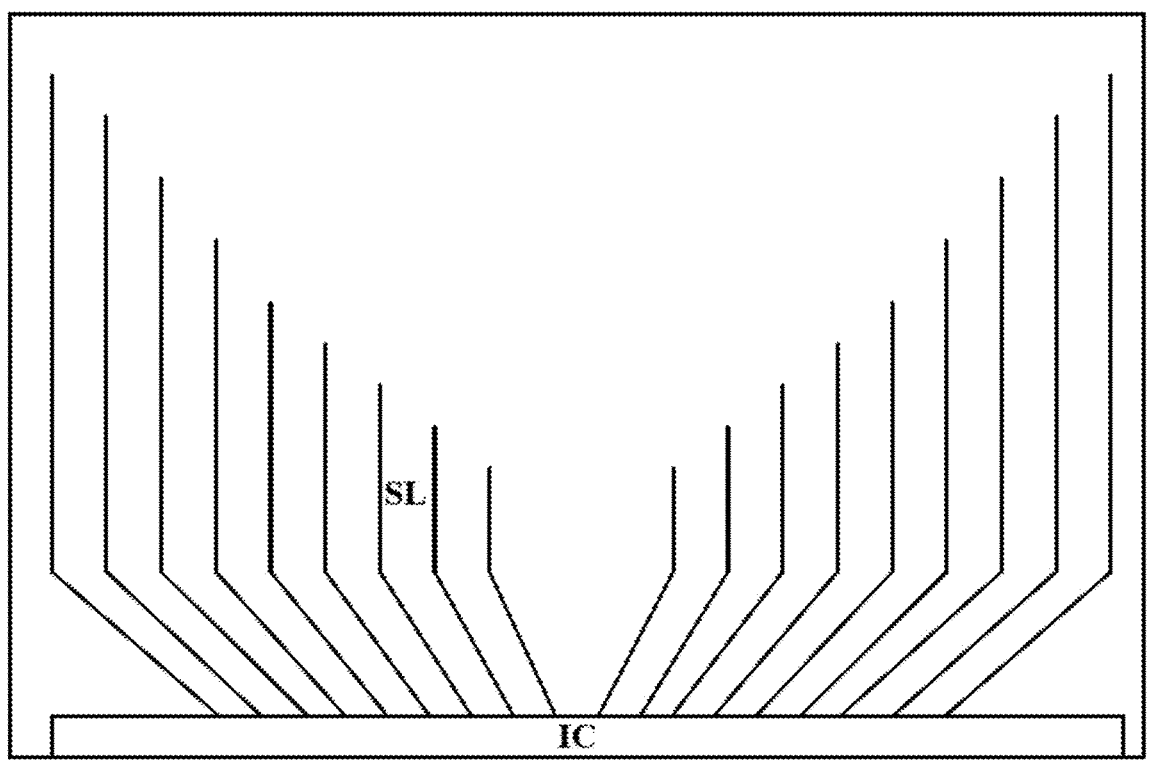
FIG. 15 illustrates a signal line arrangement in a light emitting substrate in some embodiments according to the present disclosure.

FIG. 15 illustrates a signal line arrangement in a light emitting substrate in some embodiments according to the present disclosure. Referring to FIG. 15, the signal lines (e.g., second voltage signal line in the M number of groups of second voltage signal lines G1, . . . Gj, . . . , GM) extend from a light emitting area into one single side of the light emitting substrate, and connect to an integrated circuit IC in the peripheral area. This arrangement has a greater signal line distribution density.

Figure 16:
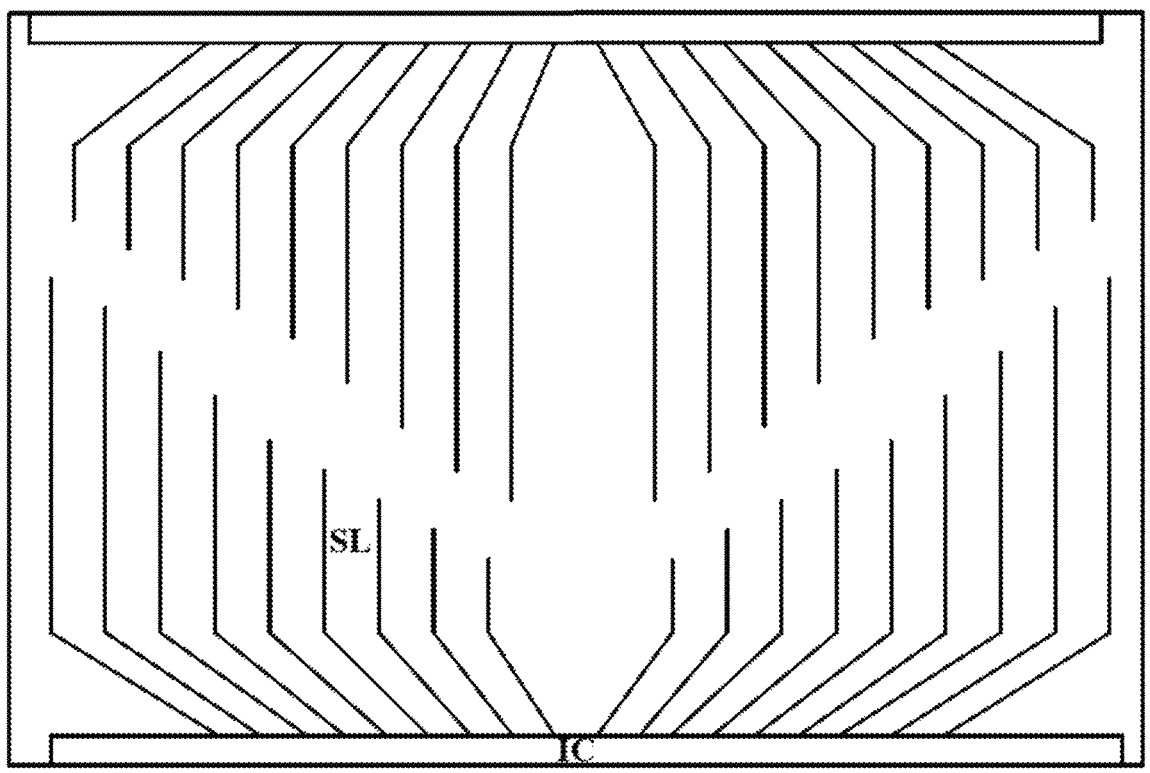
FIG. 16 illustrates a signal line arrangement in a light emitting substrate in some embodiments according to the present disclosure.

FIG. 16 illustrates a signal line arrangement in a light emitting substrate in some embodiments according to the present disclosure. Referring to FIG. 16, the the signal lines (e.g., second voltage signal line in the M number of groups of second voltage signal lines G1, . . . Gj, . . . , GM) extend from a light emitting area into both sides of the light emitting substrate, and respectively connect to two integrated circuits in two peripheral areas on two sides. As compared to the arrangement in FIG. 15, the arrangement in FIG. 16 can achieve a higher aperture ratio in the light emitting substrate, a lower signal line distribution density, or alternatively allowing disposition of more light emitting controlling units in the light emitting substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting substrate, comprising a plurality of light emitting controlling units arranged in M rows and N columns, M is an integer equal to or greater than one, N is an integer equal to or greater than one;
wherein a respective column of the N columns of light emitting controlling units comprises:
M number of groups of second voltage signal lines, a respective group of the M number of groups of second voltage signal lines connected to a respective one of the M number of light emitting controlling units, the respective group of the M number of groups of second voltage signal lines comprising k number of second voltage signal lines, k is an integer equal to or greater than one;
wherein the respective one of the plurality of light emitting controlling units comprises:
p number of sub-units, p is an integer equal to or greater than one;
p number of first voltage branch signal lines respectively connected to the p number of sub-units;
p number of groups of second voltage branch signal lines, a respective group of the p number of groups of second voltage branch signal lines comprising k number of second voltage branch signal lines;
wherein the p number of first voltage branch signal lines are electrically connected; and
the k number of second voltage branch signal lines are respectively electrically connected to the k number of second voltage signal lines in the respective group of the M number of groups of second voltage signal lines.

2. The light emitting substrate of claim 1, wherein the respective one of the plurality of light emitting controlling units comprises a plurality of light emitting elements arranged in m rows and n columns, m is an integer equal to or greater than p, n is an integer equal to or greater than one;
a P-th sub-unit of the p number of sub-units comprises n columns of light emitting elements, $1 \leq P \leq p$;
first terminals of the n columns of light emitting elements in the P-th sub-unit are commonly connected to a P-th first voltage branch signal line of the p number of first voltage branch signal lines; and
a respective second terminal of second terminals of the n columns of light emitting elements in the P-th sub-unit is connected to one of the k number of second voltage branch signal lines in a P-th group of the p number of groups of second voltage branch signal lines.

3. The light emitting substrate of claim 2, wherein each of the n columns of light emitting elements in the respective one of the plurality of light emitting controlling units comprises multiple rows of light emitting elements electrically connected in series.

4. The light emitting substrate of claim 2, wherein the multiple rows of light emitting elements in a respective one of the n columns of light emitting elements are of a same color.

5. The light emitting substrate of claim 4, wherein the respective one of the n columns of light emitting elements comprises light emitting elements of a K-th color of k number of different colors, $1 \leq K \leq k$; and
light emitting elements in (n/k) number of columns out of the n columns of light emitting elements are of the K-th color.

6. The light emitting substrate of claim 5, wherein second terminals of the (n/k) number of columns out of the n columns of light emitting elements are commonly connected to a K-th second voltage branch signal line of the k number of second voltage branch signal lines in the P-th group of the p number of groups of second voltage branch signal lines.

7. The light emitting substrate of claim 2, wherein m is a (x*p), n is a (y*k), wherein x is an integer greater than one, and y is an integer greater than one.

8. The light emitting substrate of claim 7, wherein the n columns of light emitting elements in the P-th sub-unit comprise y groups of columns;
a Y-th group of the y groups of columns comprises k number of columns of light emitting elements respectively of k number of different colors, $1 \leq Y \leq y$; and
color patterns in y groups of columns are same.

9. The light emitting substrate of claim 1, further comprising at least one first voltage signal line connected to the p number of first voltage branch signal lines in at least one of the M number of light emitting controlling units.

10. The light emitting substrate of claim 1, comprising:
a base substrate;
a first metal layer and a second metal layer on the base substrate; and
at least one insulating layer spacing apart the first metal layer from the second metal layer.

11. The light emitting substrate of claim 10, further comprising:
a plurality of signal lines; and
a black matrix on the base substrate;
wherein the plurality of signal lines comprise multiple signal lines extending along a first direction and multiple signal lines extending along a second direction, the second direction being different from the first direction;
the multiple signal lines extending along the first direction are parts of one of the first metal layer and the second metal layer;
the multiple signal lines extending along the second direction are parts of another of the first metal layer and the second metal layer; and
orthographic projections of the first metal layer and the second metal layer on the base substrate are within an orthographic projection of the black matrix on the base substrate.

12. The light emitting substrate of claim 11, wherein the black matrix comprises multiple first black matrix lines extending along the first direction and multiple second black matrix lines extending along the second direction; and
an orthographic projections of a combination of the black matrix and the plurality of signal lines on the base substrate is a grid.

13. The light emitting substrate of claim 12, wherein the multiple first black matrix lines are arranged along the second direction;
the multiple second black matrix lines are arranged along the first direction;
any two adjacent first black matrix lines of the multiple first black matrix lines are spaced apart by a same distance along the second direction;
any two adjacent second black matrix lines of the multiple second black matrix lines are spaced apart by a same distance along the first direction
a line width of a respective one of the plurality of signal lines along the first direction is smaller than a line width of black matrix lines along the first direction; and
a line width of a respective one of the plurality of signal lines along the second direction is smaller than a line width of black matrix lines along the second direction.

14. The light emitting substrate of claim 11, wherein the multiple signal lines extending along the first direction comprise second voltage signal lines; and the multiple signal lines extending along the second direction comprise first voltage branch signal lines and second voltage branch signal lines.

15. The light emitting substrate of claim 11, further comprising:

a first resin layer between the black matrix and the first metal layer; and a first passivation layer between the first resin layer and the first metal layer:

wherein the at least one insulating layer comprises a second resin layer; and the at least one insulating layer further comprises a second passivation layer between the second resin layer and the first metal layer, and a third passivation layer between the second resin layer and the second metal layer.

16. The light emitting substrate of claim 1, further comprising at least one gas releasing via:

wherein the at least one gas releasing via comprises a first gas releasing via extending through a first passivation layer and a second passivation layer and a second gas releasing via extending through a third passivation layer and a fourth passivation layer.

17. The light emitting substrate of claim 16, comprising a plurality of first gas releasing vias arranged in a first array and a plurality of second gas releasing vias arranged in a second array; wherein orthographic projections of the first gas releasing via and the second gas releasing via on the base substrate at least partially overlap with each other.

18. A display apparatus, comprising the light emitting substrate of claim 1, a reflective-type display panel, and an integrated circuit connected to the reflective-type display panel;

wherein the light emitting substrate is on a display side of the reflective-type display panel.

19. A method of driving a light emitting substrate;

wherein the light emitting substrate comprises a plurality of light emitting controlling units arranged in M rows and N columns, M is an integer equal to or greater than one, N is an integer equal to or greater than one;

wherein the method comprises:

connecting a respective group of M number of groups of second voltage signal lines to a respective one of the M number of light emitting controlling units, the respective group of the M number of groups of second voltage signal lines comprising k number of second voltage signal lines, k is an integer equal to or greater than one;

wherein the respective one of the plurality of light emitting controlling units comprises p number of sub-units, p is an integer equal to or greater than one;

where the method further comprises:

respectively connecting p number of first voltage branch signal lines to the p number of sub-units;

respectively electrically connecting k number of second voltage branch signal lines to the k number of second voltage signal lines in the respective group of the M number of groups of second voltage signal lines;

providing a second voltage signal to p number of groups of second voltage branch signal lines, a respective group of the p number of groups of second voltage branch signal lines comprising the k number of second voltage branch signal lines;

electrically connecting the p number of first voltage branch signal lines; and providing a first voltage signal to the p number of first voltage branch signal lines.

20. A method of driving a reflective display apparatus, comprising:

assembling a reflective display panel and a light emitting substrate together, wherein the light emitting substrate comprises a plurality of light emitting controlling units arranged in M rows and N columns, M is an integer equal to or greater than one, N is an integer equal to or greater than one;

respectively connecting M number of first voltage signal lines to M number of light emitting controlling units in a respective column of the N columns of light emitting controlling units; and connecting a respective group of M number of groups of second voltage signal lines to a respective one of the M number of light emitting controlling units, the respective group of the M number of groups of second voltage signal lines comprising k number of second voltage signal lines, k is an integer equal to or greater than one;

wherein the respective one of the plurality of light emitting controlling units comprises p number of sub-units, p is an integer equal to or greater than one;

wherein the method further comprises driving the light emitting substrate according to the method of claim 19.

* * * * *